United States Patent
Satpathy et al.

(10) Patent No.: US 9,306,596 B2
(45) Date of Patent: Apr. 5, 2016

(54) HYBRID CAM ASSISTED DEFLATE DECOMPRESSION ACCELERATOR

(71) Applicants: Sudhir K. Satpathy, Hillsboro, OR (US); Sanu K. Mathew, Hillsboro, OR (US); Vinodh Gopal, Westborough, MA (US); Ram K. Krishnamurthy, Portland, OR (US)

(72) Inventors: Sudhir K. Satpathy, Hillsboro, OR (US); Sanu K. Mathew, Hillsboro, OR (US); Vinodh Gopal, Westborough, MA (US); Ram K. Krishnamurthy, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 21 days.

(21) Appl. No.: 14/317,698

(22) Filed: Jun. 27, 2014

(65) Prior Publication Data

US 2015/0381202 A1      Dec. 31, 2015

(51) Int. Cl.
*H03M 7/30* (2006.01)
*H03M 7/42* (2006.01)
*G06F 12/06* (2006.01)
*G11C 15/00* (2006.01)
*G11C 15/04* (2006.01)

(52) U.S. Cl.
CPC ........... *H03M 7/425* (2013.01); *G06F 12/0646* (2013.01); *G11C 15/00* (2013.01); *G11C 15/04* (2013.01); *H03M 7/3059* (2013.01); *G06F 2212/1021* (2013.01); *G06F 2212/401* (2013.01)

(58) Field of Classification Search
CPC ..... H03M 7/3059; H03M 7/42; H03M 7/425; G11C 15/00; G11C 15/04; G06F 2212/401; G06F 12/0646
USPC .......................... 341/106, 87, 107, 65; 365/49
See application file for complete search history.

(56) References Cited

U.S. PATENT DOCUMENTS

| | | | | |
|---|---|---|---|---|
| 5,373,290 A | * | 12/1994 | Lempel | H03M 7/3088 341/106 |
| 5,455,576 A | * | 10/1995 | Clark, II | G06T 9/005 341/50 |
| 5,469,161 A | * | 11/1995 | Bezek | H03M 7/3088 341/106 |
| 6,819,579 B1 | * | 11/2004 | Liu | G11C 15/04 365/190 |
| 7,586,772 B2 | * | 9/2009 | Chai | G11C 15/04 365/189.07 |
| 8,031,502 B2 | * | 10/2011 | Kim | G11C 15/00 365/49.1 |

* cited by examiner

*Primary Examiner* — Brian Young
(74) *Attorney, Agent, or Firm* — Lowenstein Sandler LLP

(57) ABSTRACT

Disclosed is an integrated circuit including a memory device including a first portion and a second portion. The first portion is a first type of content addressable memory (CAM) with a first set of cells and the second portion is a second type of CAM with a second set of cells. The first set of cells is smaller than the second set of cells. The integrated circuit further includes a decompression accelerator coupled to the memory device, the decompression accelerator to generate a plurality of length codes. Each of the plurality of length codes include at least one bit. The plurality of length codes are generated using a symbol received from an encoded data stream that includes a plurality of symbols. The decompression accelerator further to store the plurality of length codes in the first portion of the memory device in an order according to their respective number of bits.

21 Claims, 16 Drawing Sheets

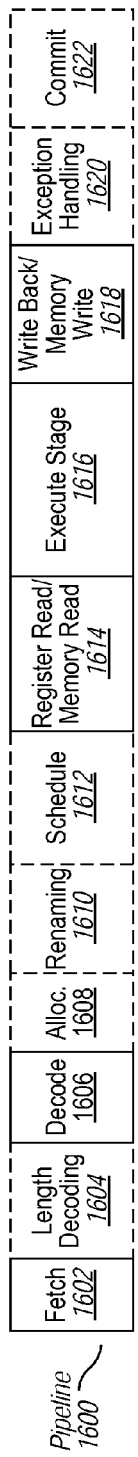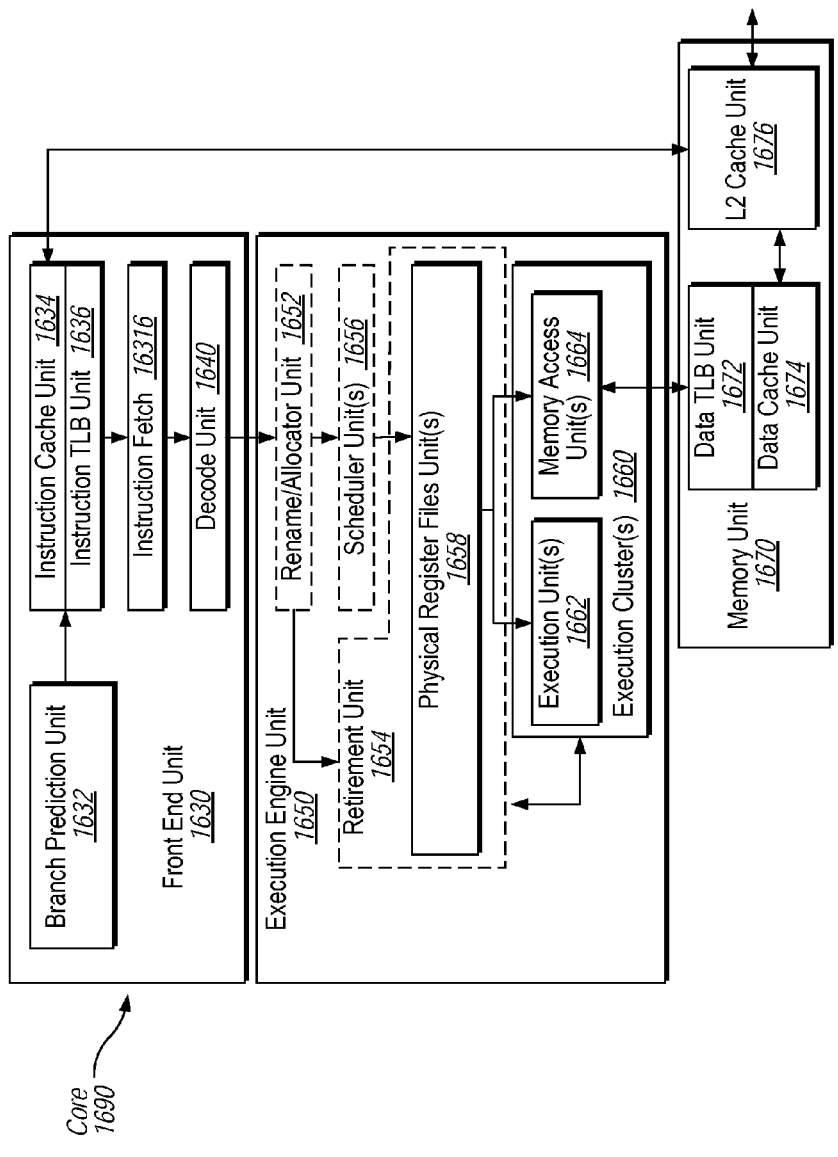

HYBRID CAM ASSISTED DEFLATE DECOMPRESSION ACCELERATOR

FEDERALLY SPONSORED RESEARCH

This invention was made with Government support under FA8650-13-3-7338 awarded by the Department of Defense. The Government has certain rights in this invention.

The present disclosure generally relates to information processing and, more specifically, relates to hybrid CAM assisted deflate decompression accelerator.

BACKGROUND

Content addressable memory is a type of computer memory that permits high speed searching operations. A CAM may search its entire memory in a single search operation responsive to receiving a data word. If the data word is found, the CAM returns a list of one or more storage addresses where the word was found. Thus, a CAM may be a hardware embodiment of an associative array.

BRIEF DESCRIPTION OF THE DRAWINGS

The present disclosure is illustrated by way of examples, and not by way of limitation, and may be more fully understood with references to the following detailed description when considered in connection with the figures.

FIG. 16A is a block diagram illustrating an in-order pipeline and a register renaming stage, out-of-order issue/execution pipeline according to at least one embodiment of the disclosure.

FIG. 16B is a block diagram illustrating an in-order architecture core and a register renaming logic, out-of-order issue/execution logic to be included in a processor according to at least one embodiment of the disclosure.

DETAILED DESCRIPTION

Figure 1:
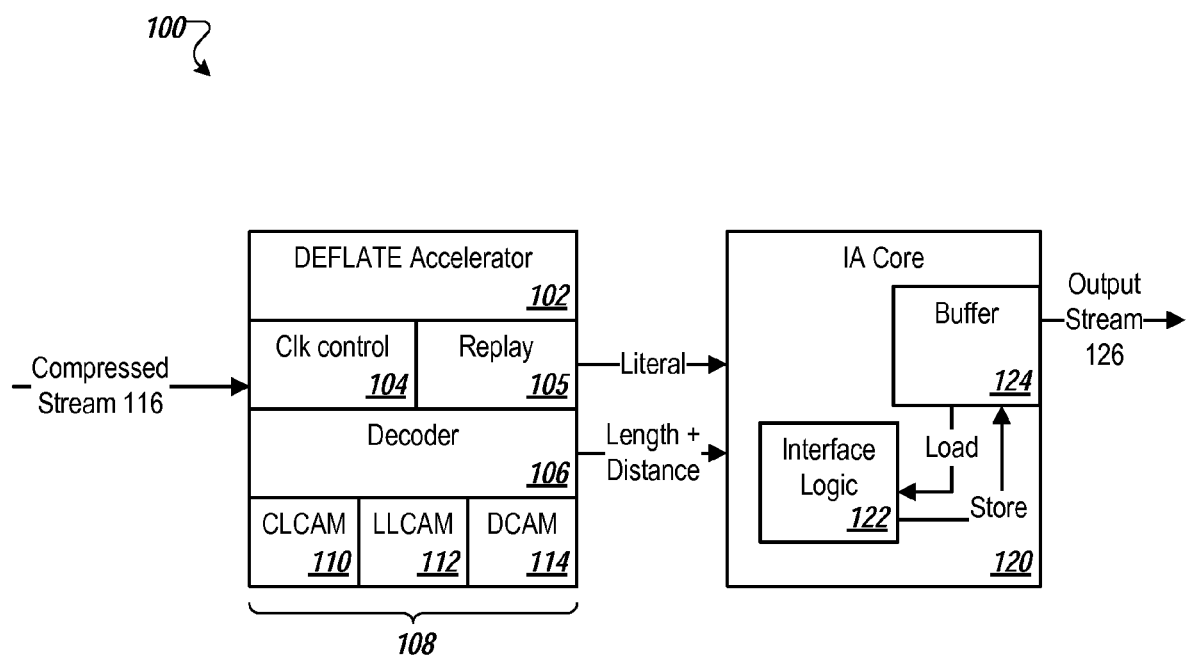
FIG. 1 illustrates a decompression system for performing data decompression of a compressed stream, in accordance with embodiments.

The present disclosure relates to data decompression. Decompression may be performed using various techniques and algorithms. There are a variety of string processing techniques and hardware designs that may be used for data decompression. Any algorithm, technique or combination thereof may be used to implement the present disclosure. For ease in explanation and by way of example, the present disclosure is described using the DEFLATE algorithm, Huffman encoding/decoding techniques and the LZ77 algorithm as specified by RFC 1951. DEFLATE is a sliding window based algorithm that compresses common substrings of characters with references in a large sliding window of history.

The DEFLATE algorithm is an efficient lossless data compression algorithm that uses a combination of the LZ77 algorithm and Huffman encoding (*DEFLATE Compressed Data Format Specification version* 1.3, Deutsch et al., Network Working Group RFC 1951, May 1996, "RFC-1951"). In DEFLATE compression, a file is divided into a sequence of data blocks and each data block is compressed separately. An end-of-block symbol is used to denote the end of each block. The LZ77 algorithm contributes to DEFLATE compression by allowing repeated character patterns to be represented with (length, distance) symbol pairs where a length symbol represents the length of a repeating character pattern and a distance symbol represents its distance, in bytes, to an earlier occurrence of the pattern. If a character pattern is not represented as a repetition of its earlier occurrence, it is represented by a sequence of literal symbols corresponding to 8-bit byte patterns.

In DEFLATE, a compressed data set includes a series of blocks, corresponding to successive blocks of input data. The block sizes are arbitrary, except that non-compressible blocks are limited to 65,535 bytes. Each block is compressed using a combination of the LZ77 algorithm and Huffman coding, which includes generating at least one Huffman tree for each block. The Huffman trees for each block are independent of those for previous or subsequent blocks and the LZ77 algorithm may use a reference to a duplicate string occurring in a previous block. The duplicate string may include a portion of the earlier processing string (e.g., up to 32K input bytes before the current string) and may be stored in a buffer.

Each block includes of two parts: a pair of Huffman code trees that describe a representation of a compressed payload, and the compressed payload itself. The Huffman trees themselves may also be compressed using Huffman encoding. The compressed data includes a series of elements of two types: literal bytes (of strings that have not been detected as duplicated within the previous 32K input bytes) (referred to as "literal" or "literals), and pointers to duplicated strings, where a pointer is represented as a pair (length, backward distance). Conventionally, the representations may be limited to distances of 32K bytes and lengths of 258 bytes. The limited size of a representation, however, may not limit the size of a block, except for uncompressible blocks, which may be limited.

Each type of value (literals, distances, and lengths) in the compressed data may be represented using a symbol (e.g., a Huffman code), using one code tree for literals and lengths and a separate code tree for distances. The code trees for each block appear in a compact form just before the compressed data for that block.

Conventionally, the values (literals, distances, and lengths) may be stored in a content-addressable memory (CAM). When decompressing an incoming data stream that is encoded (e.g., Huffman encoded), a decoder receives a symbol of the data stream and performs a look-up operation in the CAM to identify a match for the symbol. The symbol can correspond to a literal value or a length value. Conventionally, the lookup tables may be large and a lookup operation may take an excessive amount of time (e.g., long latency) as it searches the large lookup table. Further, conventional systems may use a full ternary CAM (TCAM) array to store data, which may take up a larger area on a circuit than other types of CAMs.

Embodiments of the present disclosure address these and other shortcomings by providing a hybrid CAM assisted DEFLATE decompression accelerator. In embodiments, the hybrid CAM includes different CAM types that may operate at different speeds and may use a different physical area. For example, a TCAM lookup may take longer than a binary CAM (BCAM) lookup because a TCAM lookups entail looking up ones, zeroes and "don't care," while a BCAM looks up ones and zeroes. Also, because TCAMs have ones, zeroes and "don't care" values, they may have a larger area as compared to other CAM, such as a BCAM that only has ones and zeroes. The present disclosure relates to a hybrid CAM that takes advantage of different CAM types and their respective sizes to decrease overall CAM area while improving CAM performance. In some embodiments, the CAM may be partitioned and each partition may be simultaneously searched for a match, which may also improve CAM lookup performance. In some embodiments, a register file is integrated into the CAM which enables the CAM to provide data directly from the CAM instead of providing an address to the data that is stored in another location. This may reduce a number of operations needed for decompression.

FIG. 1 illustrates a decompression system 100 for performing data decompression of a compressed stream 116 including decompression according to DEFLATE, in accordance with embodiments. However, one or more of the components may be re-tasked such that the components perform another type of decompression. Additionally, one or more of the components may be combined or further split up. The decompression system 100 includes a DEFLATE accelerator 102, clock control 104, replay logic 105, a decoder 106, at least one content addressable memory (CAM) 108 and a core 120. The components of FIG. 1 can reside on "a common carrier substrate," such as, for example, an integrated circuit ("IC") die substrate, a multi-chip module substrate or the like. Alternatively, the core 120 may reside on one or more printed circuit boards, such as, for example, a mother board, a daughter board or other type of circuit card. In other embodiments, the CAM 108 and the core 120 can reside on the same or different carrier substrates.

The DEFLATE accelerator 102 may be a de-compressor unit that may receive a compressed data stream 116. The compressed data stream 116 may include one or more compressed bits. In embodiments, the compressed data stream 116 was compressed by a data compression system (not shown). The CAM stores code words associated with the compressed data stream 116 and their relationship to respective symbols in one or more lookup tables, as further described in conjunction with FIG. 4. The CAM receives the compressed data stream 116, and matches portions of the compressed data stream 116 to the code words stored in the CAM. When a portion of the compressed data stream 116 matches a stored code word, the CAM accesses a register file and outputs the data. In some embodiments, the CAM outputs the data without accessing a RAM. The CAM may be any type of CAM, including a BCAM or a TCAM. A BCAM may support two logical states, zero and one, while a TCAM may additionally support a third, "don't care" logical state. As illustrated, the decompression system comprises three CAMs: a code length CAM (CLCAM) 110, a literal/length CAM (LLCAM) 112 and a distance CAM (DCAM) 114. Any of these CAMs may be subdivisions of a single CAM. Alternatively, each of the CAMs may be separate. Further, any of the CAMs may be any type of CAM, such as a BCAM or a TCAM. A CAM may also be a combination of two CAM types. For example, the LLCAM can include TCAM cells and BCAM cells, as described herein. Though techniques presented in this document will be primarily presented in the context of the LLCAM, they can be applied to DCAM and CLCAM as well.

The clock control 104 can manage a clock speed of a processor (e.g., core 120). The clock control logic 104 can speed up the clock speed for frequent, smaller codes accesses. For example, the clock control logic 104 may set a faster clock speed for lookups in a first portion of a CAM (e.g., a 9-bit portion) and may set a slower clock speed for lookups in a second portion of the CAM (e.g., a 6-bit portion).

The replay logic 105 may identify a "miss" in a lookup operation. After a "miss," the replay logic may interact with the clock control logic 104 to slow down the clock speed (e.g., divide by two), and replay (i.e., perform again) the same lookup operation.

The decoder 106 may construct a lookup table from the compressed stream, such as by using Huffman decoding techniques. The decoder 106 can store the lookup table in one or more CAMs. For example, the decoder 106 may store code length data in CLCAM 110, literal and length data in LLCAM 112 and distance data in DCAM 114. The decoder 106 uses the one or more lookup tables (e.g., LZ77 tables) to decode either (length, distance) pairs or literals from the compressed data stream 116. In some embodiments, the decoder includes different Huffman tables of symbols. These tables are index addressable and the indexes may be created by the decoder itself or another component. In an embodiment, the decoder includes a 4 kB lookup table. Once identified, the decoder 106 may provide the (length, distance) pairs or literals to the core 120.

The core 120 may be any type of processor, including a general purpose microprocessor, such as a processor in the Intel® Pentium® Processor Family, Intel® Xeon® Processor Family, Intel® Core™ Processor Family, or other processor family from Intel® Corporation, or another processor from another company, or a special purpose processor or microcontroller. Core 120 may include multiple threads and multiple execution cores, in any combination. In one embodiment, the core 120 is integrated in a single integrated circuit die having multiple hardware functional units (hereafter referred to as a multi-core system). The multi-core system may be a multi-core processor package, but may include other types of functional units than just processor cores. Functional hardware units may be processor cores, graphics cores (also referred to as graphics units), voltage regulator (VR) phases, input/output (I/O) interfaces (e.g., serial links, DDR memory channels) and their controllers, network controllers, fabric controllers, or any combination thereof.

The interface logic 122 of the core 120 may include any circuitry, logic, or other hardware, software, firmware, or structures to process encoded and/or compressed data. The interface logic 122 receives the (length, distance) pairs or literals. The interface logic 122 may convert DEFLATE raw outputs (e.g., literals, lengths, distances) into processor compatible instructions (e.g., loads, stores) to build an uncompressed stream. The interface logic 122 may also handle backpressure and buffer space management and may assert a stall on the DEFLATE accelerator 102 when the core 120 is not ready to consume more DEFLATE outputs. For literals, the interface logic 122 writes the literal to the buffer 124. The interface logic 122 may also provide the literal in the output stream 126. In some embodiments, the buffer 124 includes the most recent 32 KB history of the output stream.

In some embodiments, the CAM 108 may be any storage to store information, including data and/or instructions, in an information processing system, such as a register, a cache, or another type of memory structure. Such a storage structure may include any data storage structure (not shown) to store data or other information related to values generated during decompression. Alternatively, the storage structure may be included anywhere else in system 100. Data storage structure may include any type of individual storage elements, such as latches or flip-flops, to store bits of data.

Figure 2A:
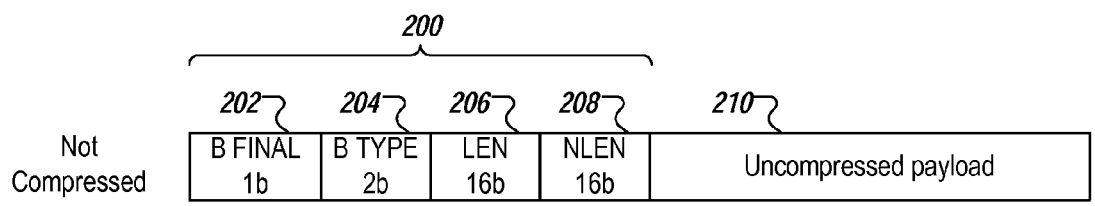
FIGS. 2A-C illustrate example header data for various encoded data streams, in accordance with embodiments.
Figure 2B:
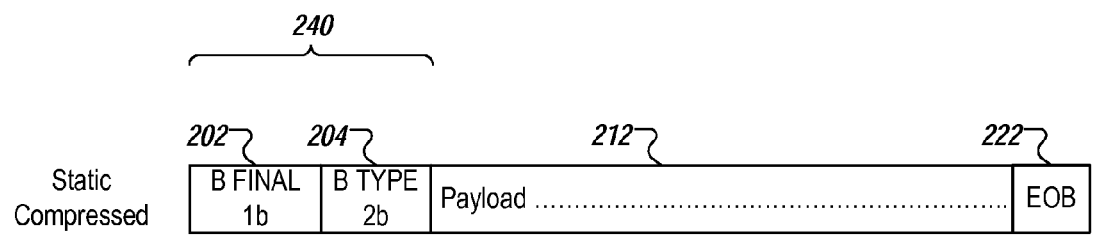
Figure 2C:
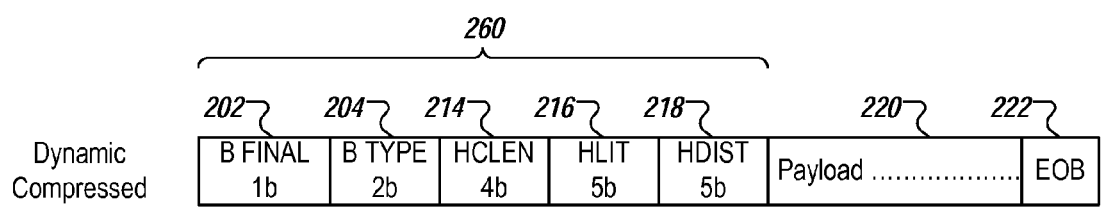

FIGS. 2A-C illustrate example header data 200, 240 and 260 for various encoded data streams, in accordance with embodiments. The header data 200, 240 and 260 includes information that may be used to generate codes for literals and lengths/distances. This information may be stored in the CAM 108 of FIG. 1 and may later be used to decompress a payload. In FIG. 2A, the header data 200 may include B FINAL 202, B TYPE 204, LEN 206 and NLEN 208. In embodiments, the header data 200 is used along with a portion of the payload 210 to generate one or more Huffman codes, which may be stored in a CAM.

B FINAL 202 is a one bit indicator that a data block is the final block in the compressed data. At the last block in the data stream, B final should be set. B TYPE 204 is a two bit indicator of the type of encoding that was used for the block. Since the B TYPE 204 is two bits, there are four possible values. For example, 00 can indicate that the block has not been compressed. A decoding system can use this indicator to refrain from creating lookup tables for the block. Moreover, a "00" B TYPE 204 can indicate to the decoding system to provide or print out the data in the block without performing any further operations to the block. A B TYPE value of 10 can indicate that the block has been encoded using dynamic Huffman encoding. A B TYPE value of 01 can indicate that the block has been encoded using static Huffman encoding. A B TYPE value of 11 can indicate that the block of the file that includes the block has been corrupted.

LEN 206 indicates a length of the block, which may be referred to as block size. The length of the block can be any size. In embodiments, the block size is between one and sixteen bits. NLEN 208 is an inverse of the length LEN 206. NLEN 208 can be used to check the LEN 206. In embodiments, the LEN and NLEN fields are provided in the header for uncompressed blocks.

FIGS. 2B-2C illustrate example header data 240 for a static compressed data stream (FIG. 2B) and a dynamic compressed data stream (FIG. 2C). Components of a data processing system (e.g., decompression system 100 of FIG. 1) may use the header data 240, 260 when processing the data block. When a source file is compressed, it may be compressed in blocks (e.g., block by block). In embodiments, each block has maximum length of 64000. Every block has its own set of tables and each block has a symbol that corresponds to the respective block. When decoding a compressed block, lookup tables are generated for each block using the header data 240, 260. The header data 240 for a data block in a static compressed data stream may include B FINAL 202 and B TYPE 204. A static compressed payload 212 may also be associated with the header data 240. In embodiments, the header data 240 is stored along with the compressed payload 212 in a CAM.

The header data 260 for a data block in a in a dynamic compressed data stream may include B FINAL 202, B TYPE 204, HCLEN 214, HLIT 216, HDIST 218. A dynamic compressed payload 220 may also be associated with the header data 260. In some embodiments, the header data 260 is used along with at least a portion of the dynamic compressed payload 220 to compute Huffman codes, which may be stored in a CAM. For example, an ALU may read the HCLEN 214, add four, read HCLEN+4 code-lengths from payload 226 and compute HCLEN+4 Huffman codes that may then be stored in the CAM. Similarly, the ALU may compute HLIT+257 literal and length Huffman codes and HDIST+1 distance Huffman codes and store them in a CAM.

For blocks that are compressed using static or dynamic coding, the header may include an end-of-block (EOB) code 222 which may be used to indicate where the current block ends.

Figure 3:
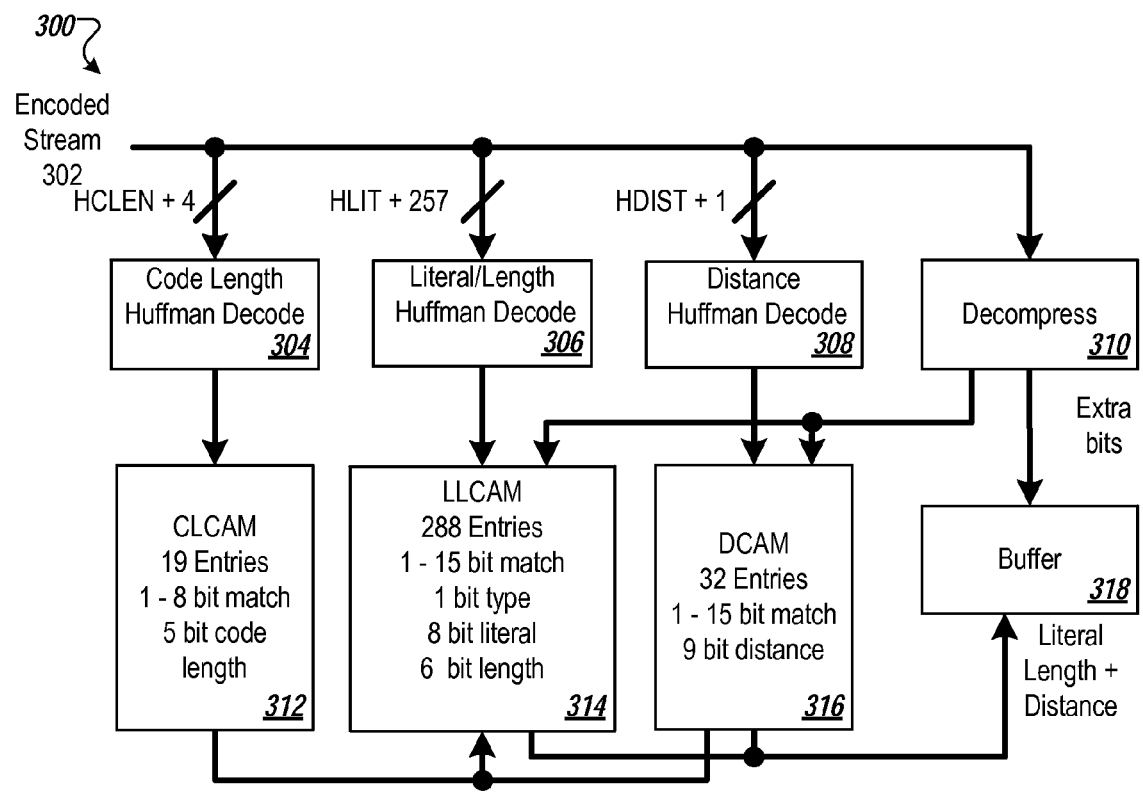
FIG. 3 illustrates a block diagram of a decompression pipeline in accordance with embodiments.

FIG. 3 illustrates a block diagram of a decompression pipeline 300 in accordance with embodiments. The decompression pipeline 300 can use any algorithm, such as DEFLATE. DEFLATE uses a data compression algorithm (e.g., LZ77) along with the canonical Huffman prefix coding scheme to generate literals and length+distance pairs using references from a history buffer 318 (e.g., buffer 124 of FIG. 1). The history buffer 318 can be any size. The decompression pipeline 300 may be performed by the decompression system 100 of FIG. 1.

In embodiments, the history buffer is 32 KB. The literal and length codes are placed together in a 288 entry LLCAM 314 while the distance codes are stored in a 32 entry DCAM 316. The literal symbols and the length and distance symbols may be encoded to achieve further compression. Information to decode the symbols are stored in a 19 entry CLCAM 312. For every block of incoming compressed stream, the three CAMs (CLCAM 312, LLCAM 314, DCAM 316) are populated following which literals or length+distance pairs are decoded and the original bit-stream is recreated.

The decompression pipeline 300 begins when the decompression system receives an encoded data stream 302. The decompression system reads a header associated with the encoded data stream 302 (e.g., the header of FIG. 2). Upon reading the header, the decompression system performs code length Huffman decode 304 using the HCLEN from the header and adding 4 (HCLEN+4). The HCLEN+4 code lengths are placed in the CLCAM 312. In this example, the CLCAM may store 19 entries with up to a 5 bit code length and matches between 1-8 bits. The decompression system populates the LLCAM 314 and DCAM 316 in a similar manner. For the LLCAM 314, when performing the literal/length decode 306, the decompression system obtains the HLIT from the header and adds 257. The decompression system computes the codes for HLIT+257 literal and length combinations and places them in the LLCAM 314. The LLCAM may store 288 entries with up to an 8 bit literal and up to a 6 bit length, a 1-15 bit match and a 1 bit type. For the DCAM 316, the decompression system performs distance decode 308 by reading the header, obtaining the HDIST, adding one, computing the codes for the distances, and storing the distances in the DCAM 316. The DCAM 316 may have 32 entries with up to a 9 bit distance and 1-15 bit match.

The decompression pipeline 300 also includes decompress 310, where the decompression system reads a payload and performs a lookup operation to find a match in the LLCAM 314. If the match is a literal in the LLCAM 314, the decompression system shifts the payload by a number of bits consumed. The decompression system again performs a lookup operation to find a match in the LLCAM 314. When the match in the LLCAM 314 is a length, the decompression system shifts the payload by the number of bits consumed and then tries to find a match in the DCAM 316. Next, the decompression system accesses the LLCAM 314 to find the next match. The decompression system continues to perform lookup operations to find matches until the decompression system finds a match for an end-of-block ("EOB") code in LLCAM 314. In some embodiments, the number of bits consumed in each match is the match-length in addition to a number of extra-bits that the decompression system may pick from the payload that are needed to create the lengths and distances. The literals and length/distance pairs that the decompression system generates are stored in the buffer 318 and are subsequently sent to the core 120 of FIG. 1 to recreate the original, uncompressed data stream.

Figure 4:
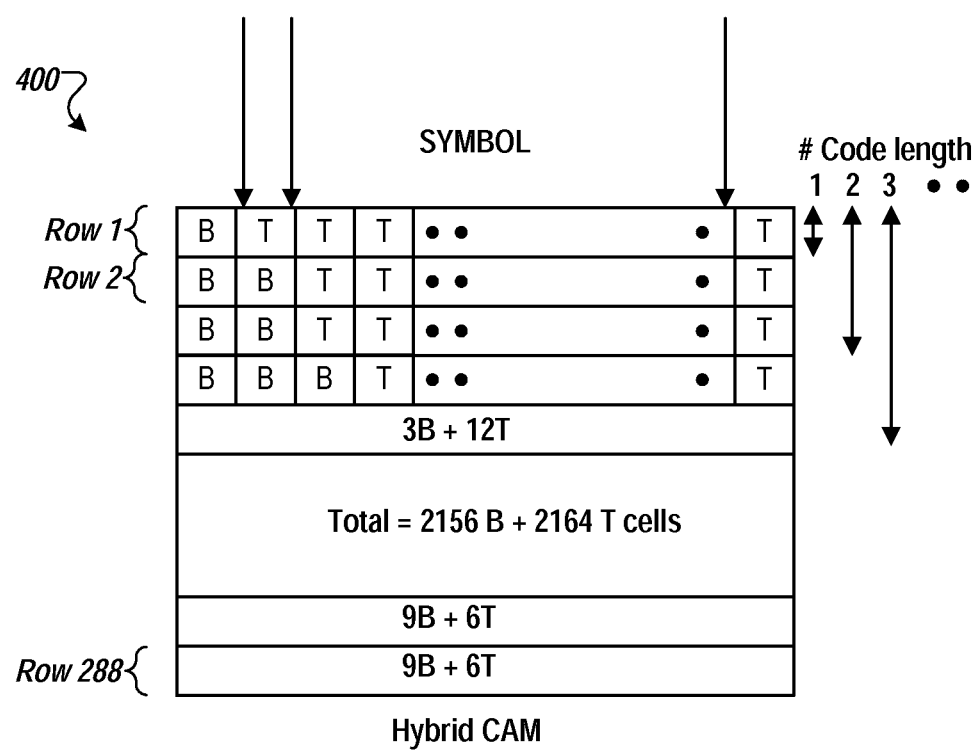
FIG. 4 illustrates an example hybrid CAM architecture in accordance with some embodiments.

FIG. 4 illustrates an example hybrid CAM architecture 400 in accordance with some embodiments. Before symbols in the compressed data stream are decoded, the compressed data stream is parsed (such as by the DEFLATE accelerator 102 of FIG. 1). As illustrated, the hybrid CAM includes 288 rows. The symbols from the bit stream can be stored in the rows in the hybrid CAM. Each symbol can be stored in a different row. Each row may have multiple cells that each can store a value. BCAM cells may store a 1 or a 0 and TCAM cells may store a 1, a 0 or a "don't care."

The symbols can be stored in the CAM in an order of their code length, such as when the symbols are Huffman encoded. The canonical nature of the Huffman coding permits a fixed number of codes of any particular length. In Huffman coding, (n−1) symbols are possible for a given length that is $\log_2 n$. In other words, in Huffman coding there is one 1 bit code, three 1-2 bit codes, seven 1-3 bit codes, and so on. The hybrid CAM can be configured to benefit from Huffman coding by storing each symbol in an order of their code length (e.g., in an increasing order of code length). When the symbols in the hybrid CAM are looked up for a possible match, the first row can be configured to handle a maximum number of possible matches because symbols of any length will be a match. The next row can handle fewer possible matches. As the lookup operation progresses down the rows, there can be fewer possible matches. For example, the CAM may be configured to have 288 rows, where each row corresponds to a symbol that can be between 1-15 bits long. Instead of using a conventional TCAM that stores each bit in a TCAM cell, each row can include different types of cells. As shown each row can include at least one BCAM cell and at least one TCAM cell. The first row can be configured to have one BCAM cell and the rest of the cells are TCAM cells. This configuration may handle the most possible cases because the "don't care" in the TCAM cells will match with any symbol. Because the TCAM cells are larger in physical area than BCAM cells, this row is the largest in physical size because it has the most TCAM cells. The next row has more BCAM cells and fewer TCAM cells, which means there are fewer "don't cares" and the physical size is smaller than the first row. As illustrated, only a 1 bit symbol can occupy the row 1, only 2 bit symbols can occupy rows 1-3. Thus, lower rows can have more BCAM cells and fewer TCAM cells, which means lower rows can have a smaller physical area. Table 1 below illustrates an example hybrid CAM configuration. The example HCAM can include 2156 B cells and 2164 T cells. Table 2 below example area savings when using the example Hybrid CAM configuration set forth in Table 1, as compared to a full TCAM in a scenario where the width of a bank of cells is determined by its longest row.

TABLE 1

Example Hybrid CAM Configuration

| Row Type | Number of Rows | Bank |
| --- | --- | --- |
| 1B8T | 1 | 1 |
| 2B7T | 2 | 1 |
| 3B6T | 4 | 1 |
| 4B5T | 8 | 1 |
| 5B4T | 16 | 1 |
| 6B3T | 32 | 1 |
| 7B2T | 64 | 2 |
| 8B1T | 128 | 3, 4 |
| 9B | 33 | 4 |

TABLE 2

Example area savings for hybrid CAM

| Bank | Area Saving |
| --- | --- |
| 1 | 3.7% |
| 2 | 25.7% |
| 3 | 29.3% |
| 4 | 29.3% |

In embodiments, the hybrid CAM may be partitioned where one partition may include multiple cell types and another partition may include one cell type. Partitioning the hybrid CAM may be beneficial because not all symbols are accessed with equal probabilities during decoding. In other words, smaller symbols (i.e., symbols with shorter lengths) may be accessed more frequently than larger symbols (i.e., symbols with longer lengths). Conventionally, a CAM may be configured for up to 15 bit possible matches. On average 95% of lookup operations for a 15 bit CAM 108 result in a match that is 1 bit to 9 bits. Thus, partitioning the hybrid CAM into a 9 bit array and a separate 6 bit array, and searching the 9 bit array first, may improve lookup latency 95% of the time. In some embodiments, either the 9 bit array, the 6 bit array or both, may be a NAND based circuit implementation that may not be suitable for matching long symbols. An example NAND BCAM cell is further described in conjunction with FIG. 7.

Figure 5A:
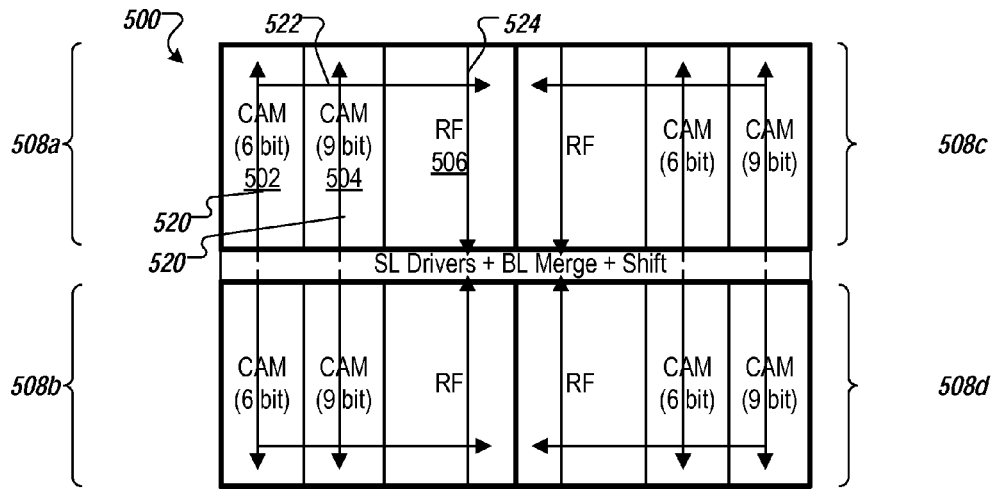
FIG. 5A illustrates an example CAM and register file architecture that permits simultaneous symbol lookup and content fetch, in accordance with embodiments.

FIG. 5A illustrates an example CAM and register file architecture 500 that permits simultaneous symbol lookup and content fetch, in accordance with embodiments. The architecture 500 may include a CAM with at least two partitions, as described herein. As illustrated, the CAM includes a 6 bit CAM 502 and a 9 bit CAM 504, which may function together to handle 15 bit codes. To enable single cycle symbol decode, a register file (RF) 506 may be integrated into the CAM for simultaneous content fetching and symbol matching. Because the register file is integrated in the CAM, data can be served directly from the CAM instead of from another location (e.g., a RAM) as may be done conventionally. For ease in explanation, FIG. 5A illustrates an LLCAM, such as LLCAM 112 of FIG. 1. Any type of CAM is contemplated.

The architecture 500 receives a symbol and then one or more of the CAMs 502, 504 initiates a lookup to identify a match for the symbol, which is represented by search line 520. The lookup operation can identify a literal or a length code within the CAM. When the search line 520 corresponds to a match, a match line 522 is provided as a word line to a corresponding row in the register file 506. In other words, the lookup operation attempts to match the input symbol with the CAM along with the literal or length data.

In an example, a 9 bit symbol is provided to the architecture 500. The 9 bit symbol is provided to the 9 bit CAM 504 and the CAM 504 searches for a match to the 9 bit symbol (520). When the CAM 504 identifies a match to the symbol (522), the CAM 504 can also directly access the register file that contains literal or length data (522). The literal or length data is output directly from the CAM (524).

In embodiments and as illustrated, the architecture 500 may be divided into four banks 508a-d, where each bank includes a 6 bit CAM 502 and a 9 bit CAM 504. Each bank also has its own register file 506. When a CAM includes 288 rows or entries, the 288 rows or entries may be divided among the four banks 508a-d. Each register file 506a-d can include different symbols such that the 288 rows are divided among the four banks. When the architecture 500 receives a symbol, the symbol can be provided to each bank 508a-d, where it is searched for a match. In embodiments, one of the four banks includes a match. When the match is located, literal or length data that corresponds to the match is provided from the bank where it was located. The architecture 500 also includes a search line (SL) driver 510, bit line (BL) merge logic 512 and a shifter 514, which each may be centrally positioned between the four banks 508. The central position of these components may reduce interconnect delay, among providing other benefits.

Figure 5B:
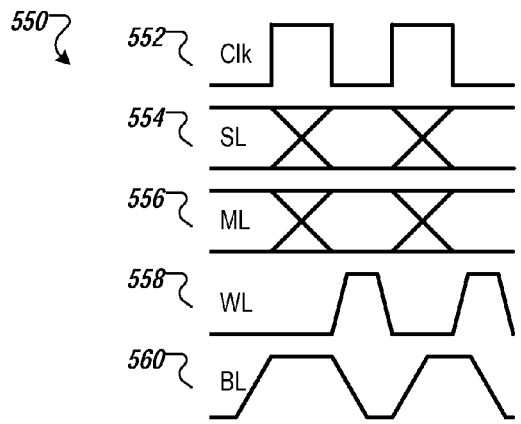
FIG. 5B illustrates a timing diagram for simultaneous symbol lookup and content fetch, in accordance with embodiments.

FIG. 5B illustrates a timing diagram 550 for simultaneous symbol lookup and content fetch, in accordance with embodiments. As shown in FIG. 5B, during a positive phase of a clock cycle "clk" 552, all register file word-lines "WL" 558 are held low. The WL 558 can correspond to 522 of FIG. 5A. This allows the bit-lines 560 to precharge. The bit lines 562 can correspond to 524 of FIG. 5A. Simultaneously, a symbol is provided to the CAM search lines "SL" 554 (which may correspond to 520 of FIG. 5A) and match lines "ML" 556 (which may correspond to 522 of FIG. 5A) are toggled. During a negative phase of "clk" 552, the match lines 522 are coupled to the word-lines 558. In the event of a successful match, only one word-line 558 is raised high and the corresponding content is read out of the CAM.

Figure 5C:
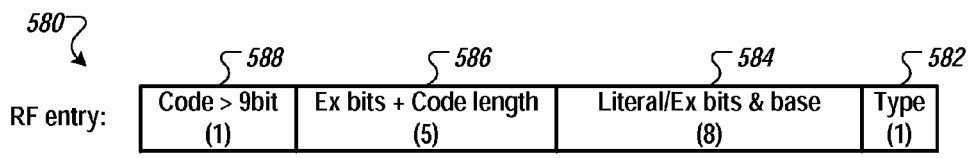
FIG. 5C illustrates an example entry in a register file that is integrated in a CAM in accordance with embodiments.

FIG. 5C illustrates an example entry 580 in a register file that is integrated in a CAM in accordance with embodiments. The register file entry 580 can include a 1 bit "Type" field 582 that indicates if the corresponding symbol is a literal or a length. The next field 584, which may be 8 bits, may be used to indicate the literal (8 bits) or a base (3 bits) and extra bits (3 bits) for a length. For a length code in field 584, the unused 2 bits may be used when the length is 258. As opposed to conventional approaches that may store the code length, the sum of extra bits and code length is stored in the next bit-field 586. This information may be directly fed into a shifter as the shift amount to fetch the next symbol. Field 586 removes a 4 bit adder and corresponding delay that is typically used in conventional systems, thereby improving overall performance. The last field 588 in the RF entry 580 may be a single bit that may be set for rows that are populated with codes longer than 9 bits. Information in field 588 may be used to replay a symbol by searching the non-critical (6 bit) portion of a CAM in the event of an unsuccessful critical (9 bit) match.

Figure 6:
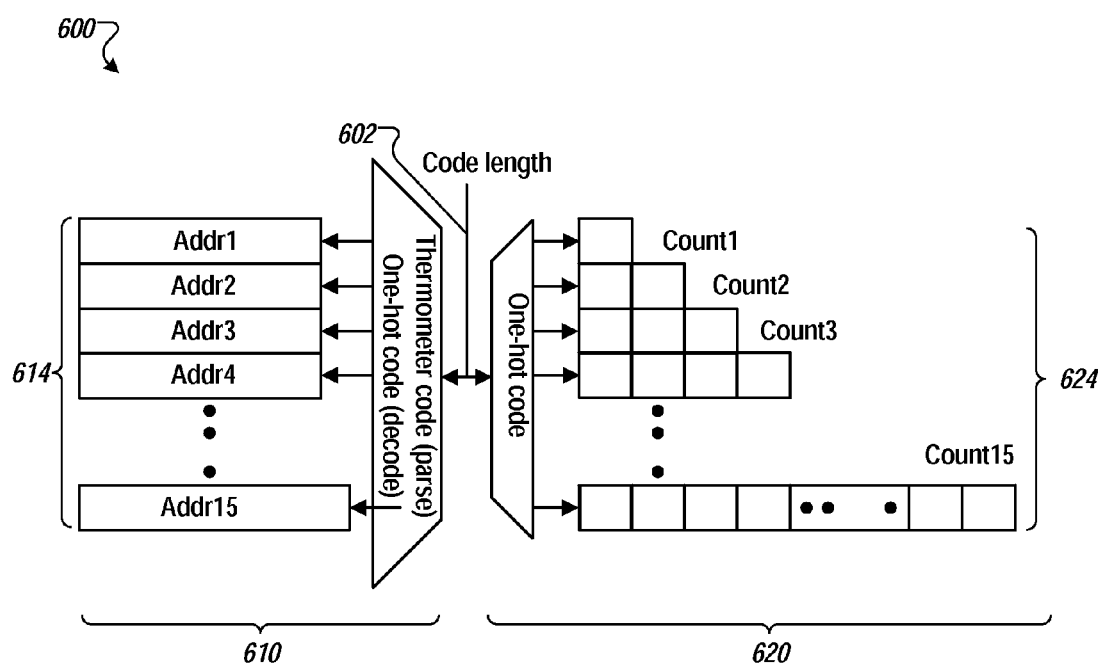
FIG. 6 illustrates a decoder for simultaneous address and code generation in accordance with embodiments.

FIG. 6 illustrates a decoder 600 for simultaneous address and code generation in accordance with embodiments. The decoder 600 may be an example embodiment of 304, 306, 308 of FIG. 3. In some embodiments, the decoder may be used for 306 and 308, where code-lengths are 1-15 bits long. The decoder 600 receives a compressed stream 602 (such as the compressed stream 116 of FIG. 1). The decoder 600 identifies header information associated with the compressed stream 602, such as headers 200, 240 or 260 of FIG. 2A, 2B, or 2C, respectively. When processing the compressed stream 602 in blocks, the decoder 600 may receive a header for each block. The decoder 600 may compute various information from the header, which may be stored in a CAM, such as CAM 108 of FIG. 1, for decompression. The decoder 600 may use an ALU to processes at least a portion of data included in the header. In embodiments, the decoder 600 is a Huffman decoder.

The decoder 600 parses compressed header information and populates a CAM (e.g., a 288 entry literal/length LLCAM) for subsequent symbol decompression. The decoder 600 includes an address generation unit 610 and a code generation unit 620 to enable CAM population in order of increasing code lengths to improve search performance.

The decoder 600 may operate in various modes. One of the modes is a parsing mode. When in parsing mode, the decoder 600 may use incoming code-lengths to generate thermometer code and one-hot code to selectively increment a bank of address counters 614 and a bank of LL counters 624. In embodiments, the address generation unit 610 may simultaneously increment address counters 614 corresponding to lengths smaller than the input code-length. In embodiments, the code generation unit 620 may increment one LL counter 624 (e.g., "Count1" or "Count2" . . . or "Count15") in a given cycle.

In an example, the decoder 600 may receive a 10 bit code. Without receiving all of the codes in the stream and/or block, the decoder 600 may not be able to put the 10 bit code in an order with respect to the other codes. The decoder 600 generates an initial count for the 10 bit code and continues to identify additional codes. As the decoder 600 receives additional codes, the decoder 600 can identify how many codes have been received for each possible code length. To adjust the order of the codes, the decoder can increment the counters in accordance with "thermometer code." For example, when the first code has 6 bits, the thermometer code is 0000 0000 0011 1111. The decoder 600 increments the address counters 614 from one to six (e.g., Addr1, Addr2 . . . Addr6), since the first code was 6 bits in length. The one-hot code for the 6 bit first code is 0000 0000 0010 0000 so count6 of the LL counters 624 increments. When a second code has 3 bits, then the address counters 614 from one to three (e.g., Addr1, Addr2, Addr3) are incremented and count3 of the LL counters 624 is incremented. When a third code has 7 bits, then the address counters 614 from one to seven and count7 of the LL counters 624 are incremented. In this manner, the codes can be arranged in an order (e.g., increasing, decreasing) according to their length.

When in initialization mode, decoder 600 may selectively shift and accumulate the LL counters to generate the starting code words. The decoder 600 may do this serially from "Count1" to "Count15," where each counter takes one cycle to update.

In decoding mode, the decoder 600 may again parse the header of the compressed stream to generate symbols and corresponding addresses and counter banks are selectively incremented. In decoding mode, the decoder 600 increments the address counters 624 in accordance with "one-hot code" instead of "thermometer code." In some embodiments, only one LL counter and address counter may increment each cycle. The decoder 600 can populate any CAM in this manner, such as any of the LLCAM, the CLCAM and DCAM of FIG. 1.

Figure 7:
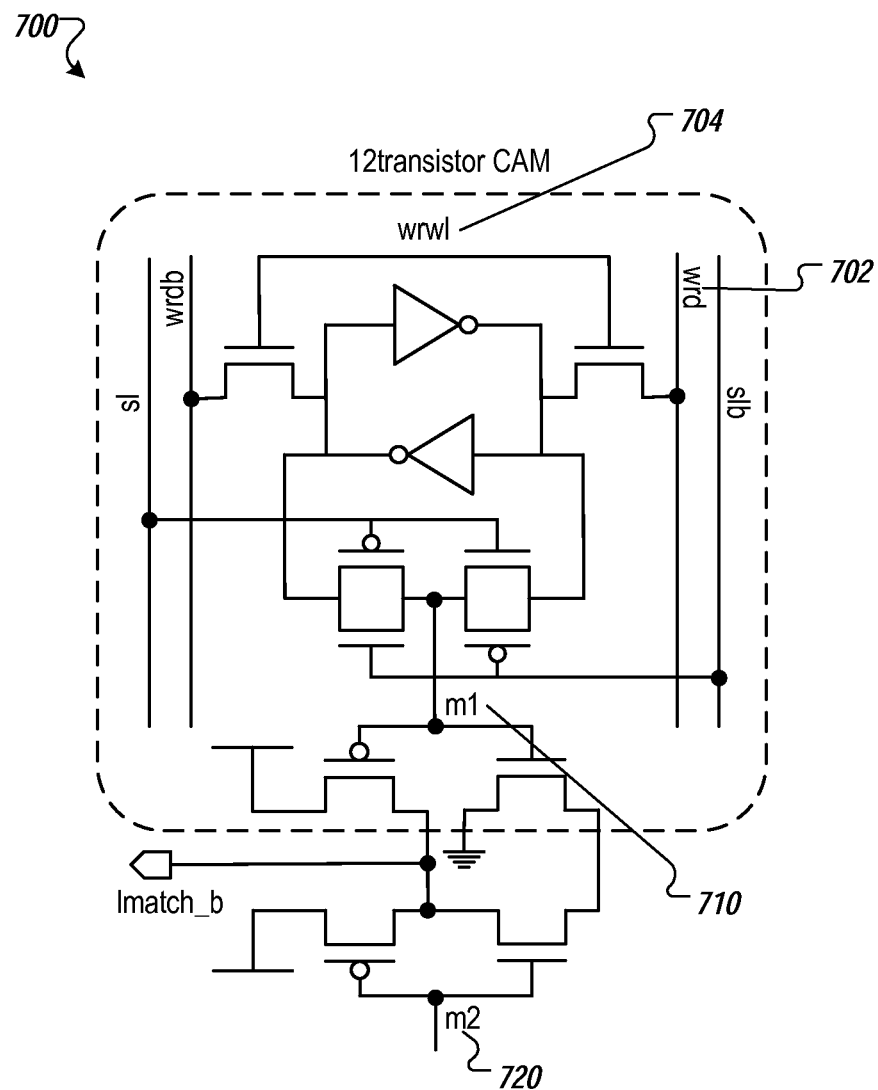
FIG. 7 illustrates a circuit diagram of a 12 transistor static NAND type binary CAM cell in accordance with embodiments.

FIG. 7 illustrates a circuit diagram of a 12 transistor static NAND type binary CAM cell 700 in accordance with embodiments. The CAM cell 700 is populated with write data "wrd" 702 by raising the write wordline "wrwl" 704. During a search or lookup operation, if the search bit matches the cell content, node m1 710 is raised high. The two transistors from a neighboring cell with node m2 720 are connected as shown to accomplish a local NAND merge. The local match nodes are merged again as shown in FIG. 8.

Figure 8:
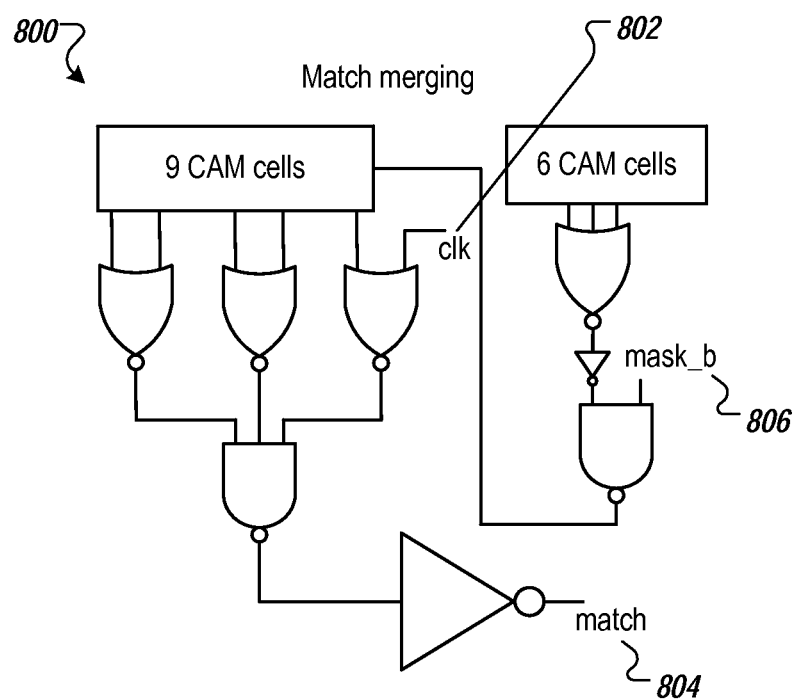
FIG. 8 illustrates match merging circuit 800 in accordance with some embodiments.

FIG. 8 illustrates match merging circuit 800 in accordance with some embodiments. During a positive phase of clk, 802 (such as is described in conjunction with FIG. 5) the match lines for all rows are pulled low. During a negative phase of clk in the event of a match 804, the output is raised high. A symbol is first decoded in the 9 bit match mode by setting mask_b 806 low. In the event of an unsuccessful match, mask_b 806 is raised high and the same symbol is matched again. The clk 802 period is doubled to accommodate the additional logic delay needed for the 15 bit match. An unsuccessful match is defined as an event when no row in a CAM matches the 9 bit symbol or when the matched row (or rows) corresponds to a code length that is larger than 9.

Figure 9:
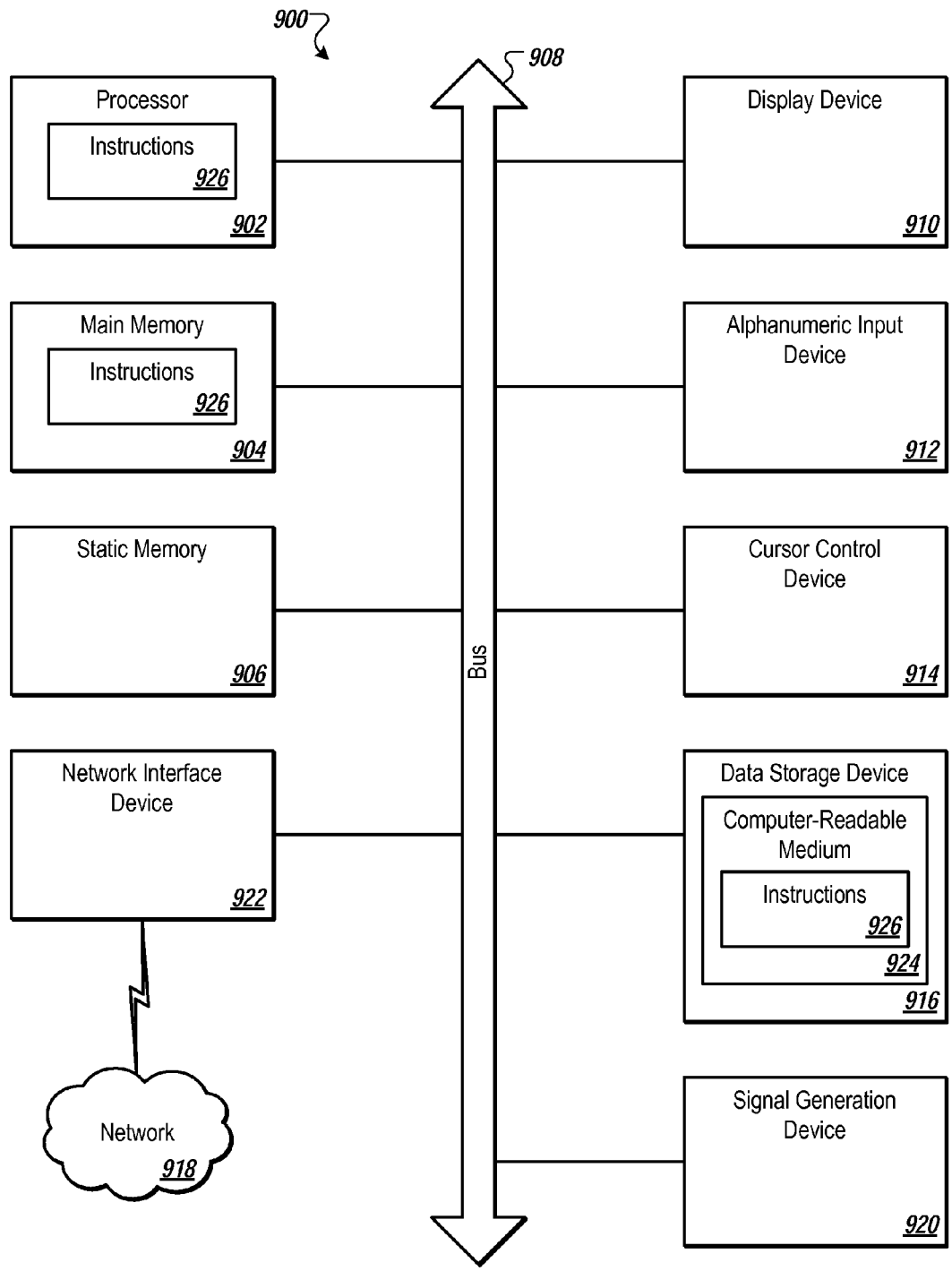
FIG. 9 illustrates a diagrammatic representation of a machine in the example form of a computing system according to embodiments.

FIG. 9 illustrates a diagrammatic representation of a machine in the example form of a computing system 900 within which a set of instructions, for causing the machine to perform any one or more of the methodologies discussed herein, may be executed. In alternative embodiments, the machine may be connected (e.g., networked) to other machines in a LAN, an intranet, an extranet, or the Internet. The machine may operate in the capacity of a server or a client device in a client-server network environment, or as a peer machine in a peer-to-peer (or distributed) network environment. The machine may be a personal computer (PC), a tablet PC, a set-top box (STB), a Personal Digital Assistant (PDA), a game console, a cellular telephone, a digital camera, a handheld PC, a web appliance, a server, a network router, switch or bridge, micro controller, a digital signal processor (DSP), system on a chip, network computers (NetPC), network hubs, wide area network (WAN) switches, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein. Embodiments are not limited to computer systems.

The computing system 900 includes a processing device 902, main memory 904 (e.g., read-only memory (ROM), flash memory, dynamic random access memory (DRAM) (such as synchronous DRAM (SDRAM) or DRAM (RDRAM), etc.), a static memory 906 (e.g., flash memory, static random access memory (SRAM), etc.), and a data storage device 916, which communicate with each other via a bus 908.

Processing device 902 represents one or more general-purpose processing devices such as a microprocessor, central processing unit, or the like. More particularly, the processing device may be complex instruction set computing (CISC) microprocessor, reduced instruction set computer (RISC) microprocessor, very long instruction word (VLIW) microprocessor, or processor implementing other instruction sets, or processors implementing a combination of instruction sets. Processing device 902 may also be one or more special-purpose processing devices such as an application specific integrated circuit (ASIC), a field programmable gate array (FPGA), a digital signal processor (DSP), network processor, or the like. In one embodiment, processing device 902 may include one or processing cores. The processing device 902 is configured to execute the processing logic 926 for performing the operations discussed herein. In one embodiment, processing device 902 can be part of the system 100 of FIG. 1. Alternatively, the computing system 900 can include other components as described herein. It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

Computing system 900 is representative of processing systems based on the PENTIUM III™, PENTIUM 4™, Celeron™, Xeon™, Itanium, XScale™, StrongARM™, Core™, Core 2™, Atom™, and/or Intel® Architecture Core™, such as an i3, i5, i7 microprocessors available from Intel Corporation of Santa Clara, Calif., although other systems (including PCs having other microprocessors, engineering workstations, set-top boxes and the like) may also be used. However, understand that other low power processors such as available from Advanced Micro Devices, Inc. (AMD) of Sunnyvale, Calif., a MIPS-based design from MIPS Technologies, Inc. of Sunnyvale, Calif., an ARM-based design licensed from ARM Holdings, Ltd. or customer thereof, or their licensees or adopters may instead be present in other embodiments such as an Apple A5/A6 processor, a Qualcomm Snapdragon processor, or TI OMAP processor. In one embodiment, processing device 101 executes a version of the WINDOWS™ operating system available from Microsoft Corporation of Redmond, Wash., although other operating systems (OS X, UNIX, Linux, Android, iOS, Symbian, for example), embedded software, and/or graphical user interfaces, may also be used. Thus, embodiments of the present disclosure are not limited to any specific combination of hardware circuitry and software. One embodiment may be described in the context of a single processor desktop or server system, but alternative embodiments may be included in a multiprocessor system. Computing system 900 may be an example of a 'hub' system architecture.

The computing system 900 may further include a network interface device 922 communicably coupled to a network 918. The computing system 900 also may include a display device 910 (e.g., a liquid crystal display (LCD) or a cathode ray tube (CRT)), an alphanumeric input device 912 (e.g., a keyboard), a cursor control device 914 (e.g., a mouse), a signal generation device 920 (e.g., a speaker), or other peripheral devices. Furthermore, computing system 900 may include a graphics processing unit (not illustrated), a video processing unit (not illustrated) and an audio processing unit (not illustrated). In another embodiment, the computing system 900 may include a chipset (not illustrated), which refers to a group of integrated circuits, or chips, that are designed to work with the processing device 902 and controls communications between the processing device 902 and external devices. For example, the chipset may be a set of chips on a motherboard that links the processing device 902 to very high-speed devices, such as main memory 904 and graphic controllers, as well as linking the processing device 902 to lower-speed peripheral buses of peripherals, such as USB, PCI or ISA buses.

The data storage device 916 may include a computer-readable storage medium 924 on which is stored instructions 926 embodying any one or more of the methodologies of functions described herein. The instructions 926 may also reside, completely or at least partially, within the main memory 904 as instructions 926 and/or within the processing device 902 as processing logic 926 during execution thereof by the computing system 900; the main memory 904 and the processing device 902 also constituting computer-readable storage media.

The computer-readable storage medium 924 may also be used to store instructions 926 utilizing the processing device 902, such as described with respect to FIG. 1, and/or a software library containing methods that call the above applications. While the computer-readable storage medium 924 is shown in an example embodiment to be a single medium, the term "computer-readable storage medium" should be taken to include a single medium or multiple media (e.g., a centralized or distributed database, and/or associated caches and servers) that store the one or more sets of instructions. The term "computer-readable storage medium" shall also be taken to include any medium that is capable of storing, encoding or carrying a set of instruction for execution by the machine and that cause the machine to perform any one or more of the methodologies of the present embodiments. The term "computer-readable storage medium" shall accordingly be taken to include, but not be limited to, solid-state memories, and optical and magnetic media.

Figure 10:
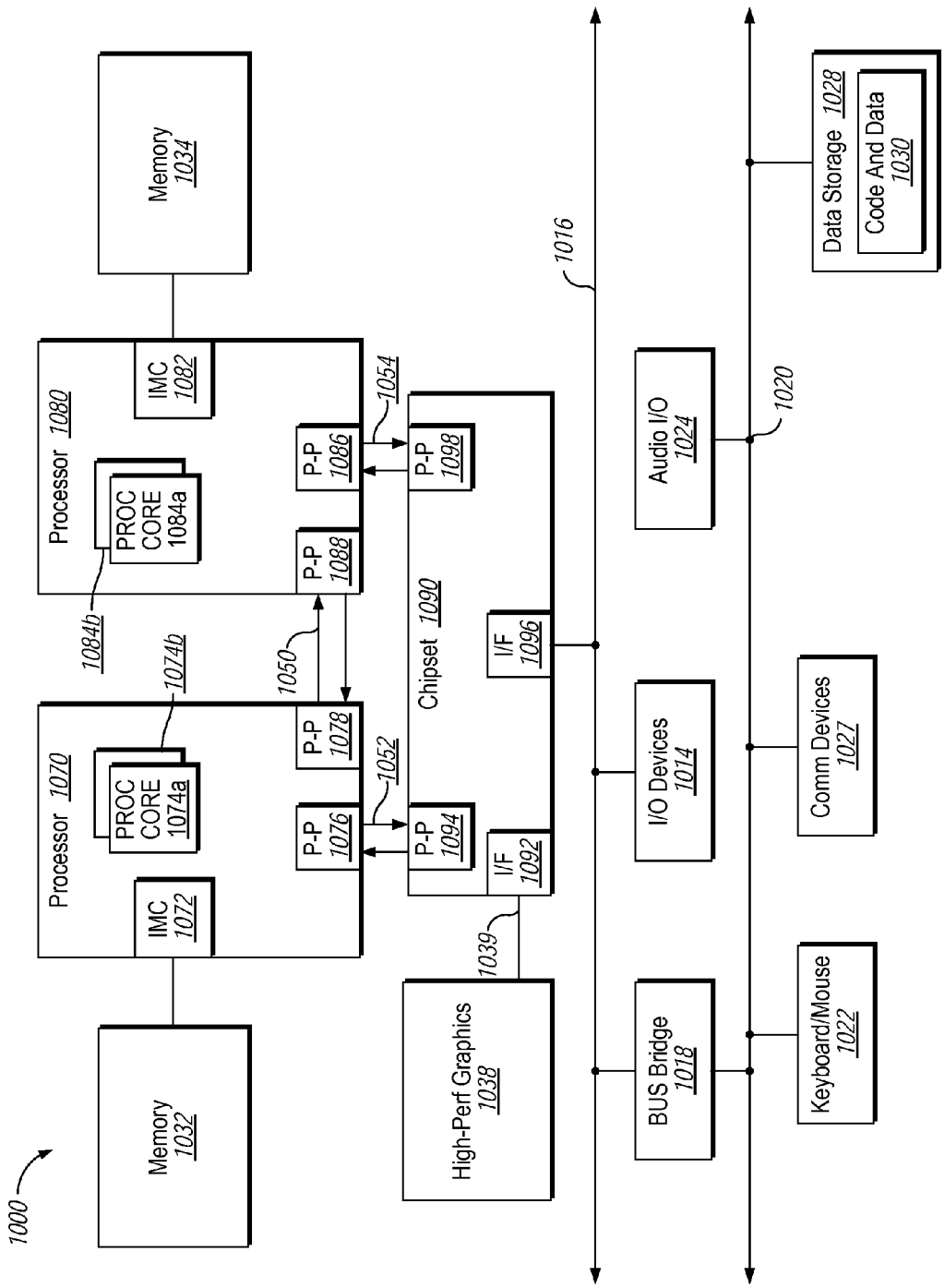
FIG. 10 illustrates a block diagram of a multiprocessor system in accordance with an embodiment.

Embodiments may be implemented in many different system types. Referring now to FIG. 10, shown is a block diagram of a multiprocessor system 1000 in accordance with an embodiment. As shown in FIG. 10, multiprocessor system 1000 is a point-to-point interconnect system, and includes a first processor 1070 and a second processor 1080 coupled via a point-to-point interconnect 1050. As shown in FIG. 10, each of processors 1070 and 1080 may be multicore processors, including first and second processor cores (i.e., processor cores 1074a and 1074b and processor cores 1084a and 1084b), although potentially many more cores may be present in the processors. The processors each may include hybrid write mode logics in accordance with an embodiment of the present.

While shown with two processors 1070, 1080, it is to be understood that the scope of the present disclosure is not so limited. In other embodiments, one or more additional processors may be present in a given processor.

Processors 1070 and 1080 are shown including integrated memory controller units 8102 and 8102, respectively. Processor 1070 also includes as part of its bus controller units point-to-point (P-P) interfaces 1076 and 1078; similarly, second processor 1080 includes P-P interfaces 1086 and 1088. Processors 1070, 1080 may exchange information via a point-to-point (P-P) interface 1050 using P-P interface circuits 1078, 1088. As shown in FIG. 10, IMCs 1072 and 1082 couple the processors to respective memories, namely a memory 1032 and a memory 1034, which may be portions of main memory locally attached to the respective processors.

Processors 1070, 1080 may each exchange information with a chipset 1090 via individual P-P interfaces 1052, 1054 using point to point interface circuits 1076, 1094, 1086, 1098. Chipset 1090 may also exchange information with a high-performance graphics circuit 1038 via a high-performance graphics interface 1039.

A shared cache (not shown) may be included in either processor or outside of both processors, yet connected with the processors via P-P interconnect, such that either or both processors' local cache information may be stored in the shared cache if a processor is placed into a low power mode.

Chipset 1090 may be coupled to a first bus 1016 via an interface 1096. In one embodiment, first bus 1016 may be a Peripheral Component Interconnect (PCI) bus, or a bus such as a PCI Express bus or another third generation I/O interconnect bus, although the scope of the present disclosure is not so limited.

As shown in FIG. 10, various I/O devices 1014 may be coupled to first bus 1016, along with a bus bridge 1018 which couples first bus 1016 to a second bus 1020. In one embodiment, second bus 1020 may be a low pin count (LPC) bus. Various devices may be coupled to second bus 1020 including, for example, a keyboard and/or mouse 1022, communication devices 1027 and a storage unit 1028 such as a disk drive or other mass storage device which may include instructions/code and data 1030, in one embodiment. Further, an audio I/O 1024 may be coupled to second bus 1020. Note that other architectures are possible. For example, instead of the point-to-point architecture of FIG. 10, a system may implement a multi-drop bus or other such architecture.

Figure 11:
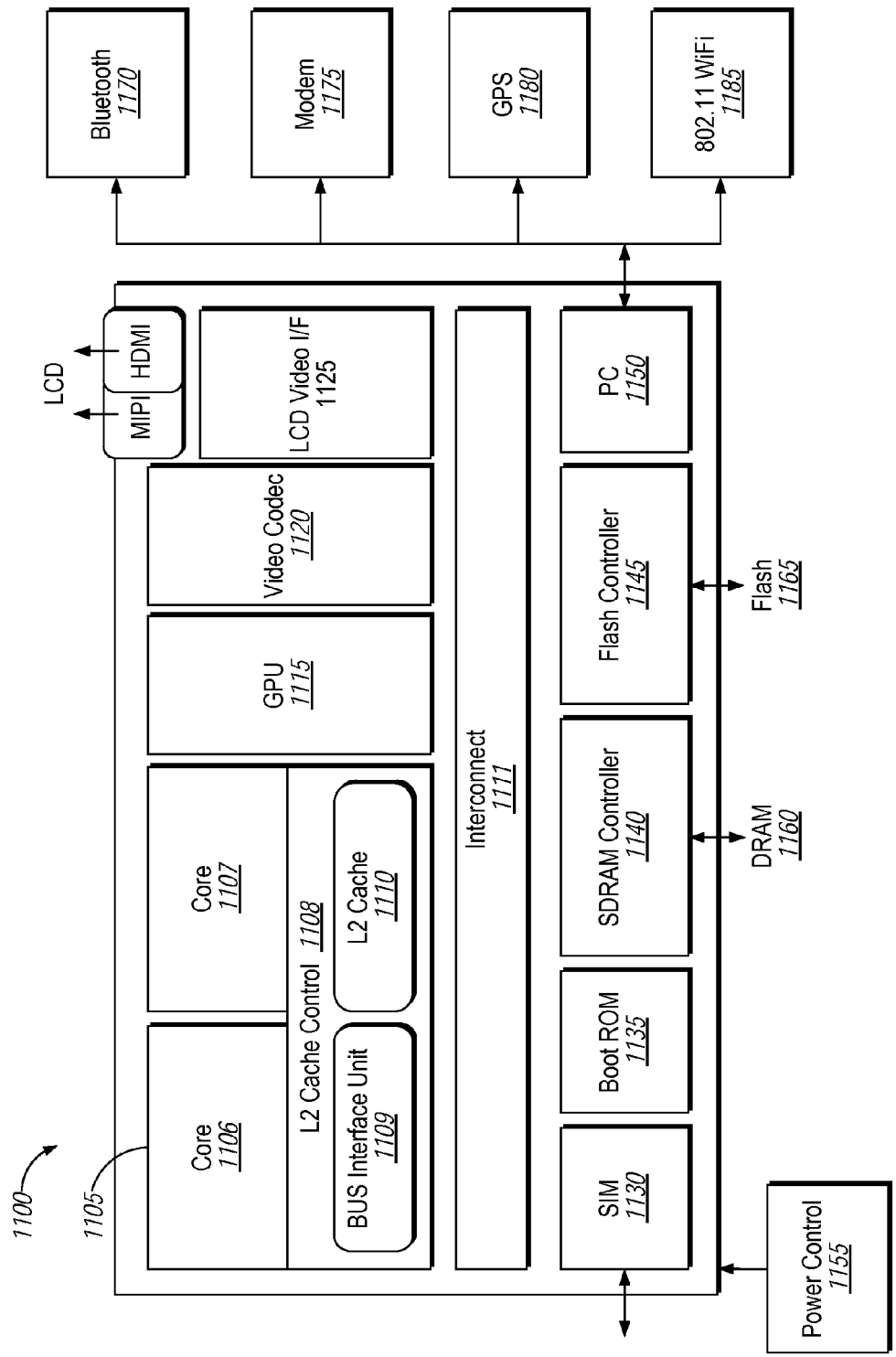
FIG. 11 illustrates a system on-chip (SOC) design in accordance with embodiments.

Turning next to FIG. 11, an embodiment of a system on-chip (SOC) design in accordance with embodiments of the disclosure is depicted. As an illustrative example, SOC 1100 is included in user equipment (UE). In one embodiment, UE refers to any device to be used by an end-user to communicate, such as a hand-held phone, smartphone, tablet, ultra-thin notebook, notebook with broadband adapter, or any other similar communication device. A UE may connect to a base station or node, which can correspond in nature to a mobile station (MS) in a GSM network.

Here, SOC 1100 includes 2 cores—1106 and 1107. Similar to the discussion above, cores 1106 and 1107 may conform to an Instruction Set Architecture, such as a processor having the Intel® Architecture Core™, an Advanced Micro Devices, Inc. (AMD) processor, a MIPS-based processor, an ARM-based processor design, or a customer thereof, as well as their licensees or adopters. Cores 1106 and 1107 are coupled to cache control 1108 that is associated with bus interface unit 1109 and L2 cache 1110 to communicate with other parts of system 1100. Interconnect 1111 includes an on-chip interconnect, such as an IOSF, AMBA, or other interconnects discussed above, which can implement one or more aspects of the described disclosure.

Interconnect 1111 provides communication channels to the other components, such as a Subscriber Identity Module (SIM) 1130 to interface with a SIM card, a boot rom 1135 to hold boot code for execution by cores 1106 and 1107 to initialize and boot SOC 1100, a SDRAM controller 1140 to interface with external memory (e.g. DRAM 1160), a flash controller 1145 to interface with persistent or non-volatile memory (e.g. Flash 1165), a peripheral control 1150 (e.g. Serial Peripheral Interface) to interface with peripherals, video codecs 1120 and Video interface 1125 to display and receive input (e.g. touch enabled input), GPU 1115 to perform graphics related computations, etc. Any of these interfaces may incorporate aspects of the embodiments described herein.

In addition, the system illustrates peripherals for communication, such as a Bluetooth module 1170, modem 1175 (e.g., 3G, 4G, Long Term Evolution (LTE), LTE-Advanced, etc.), GPS 1180, Wi-Fi 1185, Zigbee (not shown), and Z-Wave (not shown). Note as stated above, a UE includes a radio for communication. As a result, these peripheral communication modules may not all be included. However, in a UE some form of a radio for external communication should be included.

Figure 12:
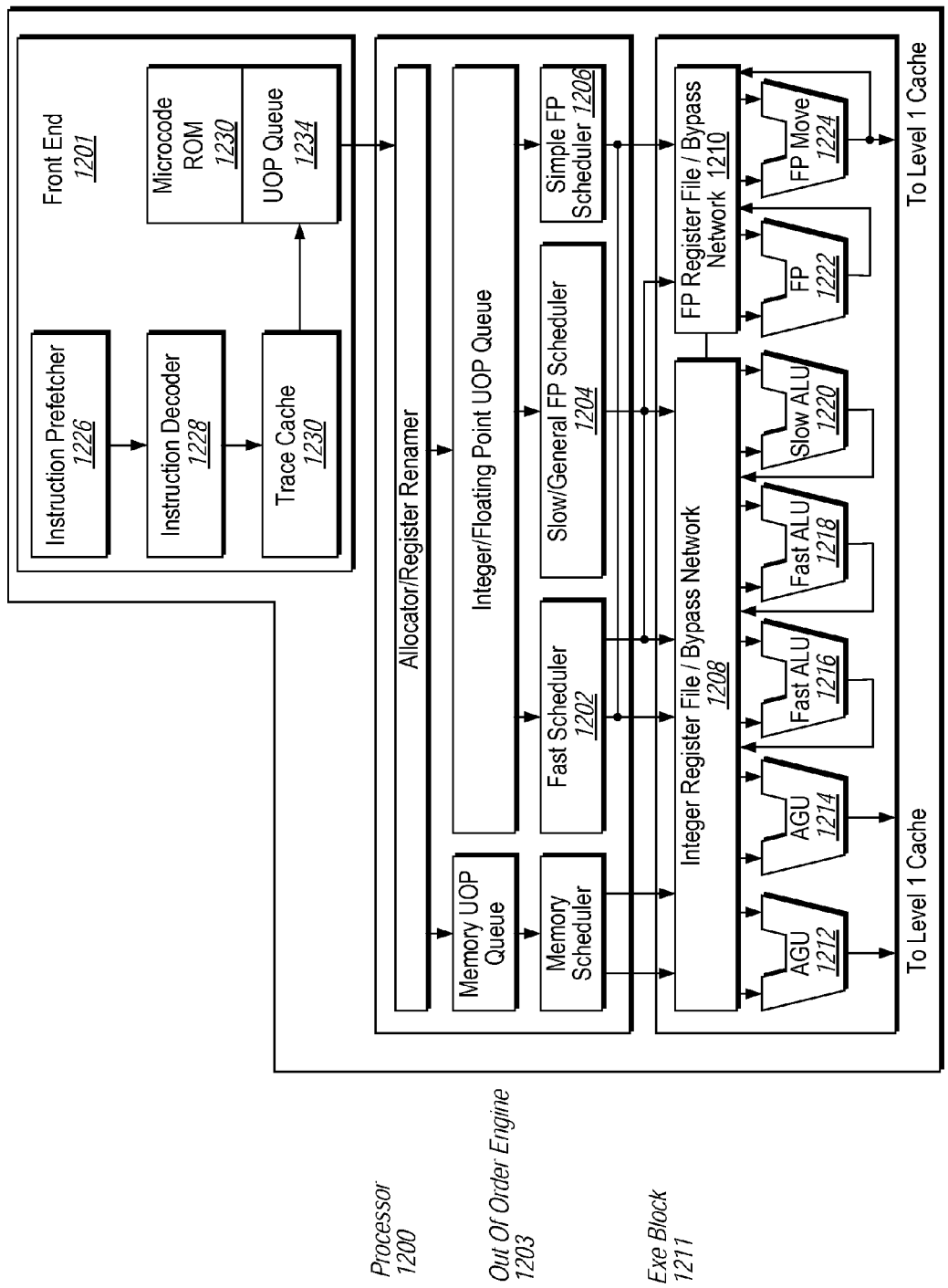
FIG. 12 is a block diagram of the micro-architecture for a processor according to embodiments.

FIG. 12 is a block diagram of the micro-architecture for a processor 1200 that includes logic circuits to perform instructions in accordance with one embodiment of the present disclosure. In some embodiments, an instruction in accordance with one embodiment can be implemented to operate on data elements having sizes of byte, word, doubleword, quadword, etc., as well as datatypes, such as single and double precision integer and floating point datatypes. In one embodiment the in-order front end 1201 is the part of the processor 1200 that fetches instructions to be executed and prepares them to be used later in the processor pipeline. The front end 1201 may include several units. In one embodiment, the instruction prefetcher 1226 fetches instructions from memory and feeds them to an instruction decoder 1228 which in turn decodes or interprets them. For example, in one embodiment, the decoder decodes a received instruction into one or more operations called "micro-instructions" or "micro-operations" (also called micro op or uops) that the machine can execute. In other embodiments, the decoder parses the instruction into an opcode and corresponding data and control fields that are used by the micro-architecture to perform operations in accordance with one embodiment. In one embodiment, the trace cache 1230 takes decoded uops and assembles them into program ordered sequences or traces in the uop queue 1234 for execution. When the trace cache 1230 encounters a complex instruction, the microcode ROM 1232 provides the uops needed to complete the operation.

Some instructions are converted into a single micro-op, whereas others need several micro-ops to complete the full operation. In one embodiment, if more than four micro-ops are needed to complete an instruction, the decoder 1228 accesses the microcode ROM 1232 to do the instruction. For one embodiment, an instruction can be decoded into a small number of micro ops for processing at the instruction decoder 1228. In another embodiment, an instruction can be stored within the microcode ROM 1232 should a number of micro-ops be needed to accomplish the operation. The trace cache 1230 refers to an entry point programmable logic array (PLA) to determine a correct micro-instruction pointer for reading the micro-code sequences to complete one or more instructions in accordance with one embodiment from the microcode ROM 1232. After the microcode ROM 1232 finishes sequencing micro-ops for an instruction, the front end 1201 of the machine resumes fetching micro-ops from the trace cache 1230.

The out-of-order execution engine 1203 is where the instructions are prepared for execution. The out-of-order execution logic has a number of buffers to smooth out and re-order the flow of instructions to optimize performance as they go down the pipeline and get scheduled for execution. The allocator logic allocates the machine buffers and resources that each uop needs in order to execute. The register renaming logic renames logic registers onto entries in a register file. The allocator also allocates an entry for each uop in one of the two uop queues, one for memory operations and one for non-memory operations, in front of the instruction schedulers: memory scheduler, fast scheduler 1202, slow/general floating point scheduler 1204, and simple floating point scheduler 1206. The uop schedulers 1202, 1204, 1206 determine when a uop is ready to execute based on the readiness of their dependent input register operand sources and the availability of the execution resources the uops need to complete their operation. The fast scheduler 1202 of one embodiment can schedule on each half of the main clock cycle while the other schedulers can schedule once per main processor clock cycle. The schedulers arbitrate for the dispatch ports to schedule uops for execution.

Register files 1208, 1210 sit between the schedulers 1202, 1204, 1206, and the execution units 1212, 1214, 1216, 1218, 1220, 1222, 1224 in the execution block 1211. There is a separate register file 1208, 1210 for integer and floating point operations, respectively. Each register file 1208, 1210, of one embodiment also includes a bypass network that can bypass or forward just completed results that have not yet been written into the register file to new dependent uops. The integer register file 1208 and the floating point register file 1210 are also capable of communicating data with the other. For one embodiment, the integer register file 1208 is split into two separate register files, one register file for the low order 32 bits of data and a second register file for the high order 32 bits of data. The floating point register file 1210 of one embodiment has 128 bit wide entries because floating point instructions typically have operands from 64 to 128 bits in width.

The execution block 1211 contains the execution units 1212, 1214, 1216, 1218, 1220, 1222, 1224, where the instructions are actually executed. This section includes the register files 1208, 1210, that store the integer and floating point data operand values that the micro-instructions need to execute. The processor 1200 of one embodiment is comprised of a number of execution units: address generation unit (AGU) 1212, AGU 1214, fast ALU 1216, fast ALU 1218, slow ALU 1220, floating point ALU 1222, floating point move unit 1224. For one embodiment, the floating point execution blocks 1222, 1224, execute floating point, MMX, SIMD, and SSE, or other operations. The floating point ALU 1222 of one embodiment includes a 64 bit by 64 bit floating point divider to execute divide, square root, and remainder micro-ops. For embodiments of the present disclosure, instructions involving a floating point value may be handled with the floating point hardware. In one embodiment, the ALU operations go to the high-speed ALU execution units 1216, 1218. The fast ALUs 1216, 1218, of one embodiment can execute fast operations with an effective latency of half a clock cycle. For one embodiment, most complex integer operations go to the slow ALU 1220 as the slow ALU 1220 includes integer execution hardware for long latency type of operations, such as a multiplier, shifts, flag logic, and branch processing. Memory load/store operations are executed by the AGUs 1212, 1214. For one embodiment, the integer ALUs 1216, 1218, 1220 are described in the context of performing integer operations on 64 bit data operands. In alternative embodiments, the ALUs 1216, 1218, 1220 can be implemented to support a variety of data bits including 16, 32, 128, 756, etc. Similarly, the floating point units 1222, 1224 can be implemented to support a range of operands having bits of various widths. For one embodiment, the floating point units 1222, 1224 can operate on 128 bits wide packed data operands in conjunction with SIMD and multimedia instructions.

In one embodiment, the uops schedulers 1202, 1204, 1206 dispatch dependent operations before the parent load has finished executing. As uops are speculatively scheduled and executed in processor 1200, the processor 1200 also includes logic to handle memory misses. If a data load misses in the data cache, there can be dependent operations in flight in the pipeline that have left the scheduler with temporarily incorrect data. A replay mechanism tracks and re-executes instructions that use incorrect data. The dependent operations should be replayed and the independent ones are allowed to complete. The schedulers and replay mechanism of one embodiment of a processor are also designed to catch instruction sequences for text string comparison operations.

The term "registers" may refer to the on-board processor storage locations that are used as part of instructions to identify operands. In other words, registers may be those that are usable from the outside of the processor (from a programmer's perspective). However, the registers of an embodiment should not be limited in meaning to a particular type of circuit. Rather, a register of an embodiment is capable of storing and providing data, and performing the functions described herein. The registers described herein can be implemented by circuitry within a processor using any number of different techniques, such as dedicated physical registers, dynamically allocated physical registers using register renaming, combinations of dedicated and dynamically allocated physical registers, etc. In one embodiment, integer registers store thirty-two bit integer data. A register file of one embodiment also contains eight multimedia SIMD registers for packed data. For the discussions below, the registers are understood to be data registers designed to hold packed data, such as 64 bits wide MMX registers (also referred to as 'mm' registers in some instances) in microprocessors enabled with the MMX™ technology from Intel Corporation of Santa Clara, Calif. These MMX registers, available in both integer and floating point forms, can operate with packed data elements that accompany SIMD and SSE instructions. Similarly, 128 bits wide XMM registers relating to SSE2, SSE3, SSE4, or beyond (referred to generically as "SSEx") technology can also be used to hold such packed data operands. In one embodiment, in storing packed data and integer data, the registers do not need to differentiate between the two data types. In one embodiment, integer and floating point are either contained in the same register file or different register files. Furthermore, in one embodiment, floating point and integer data may be stored in different registers or the same registers.

Figure 13:
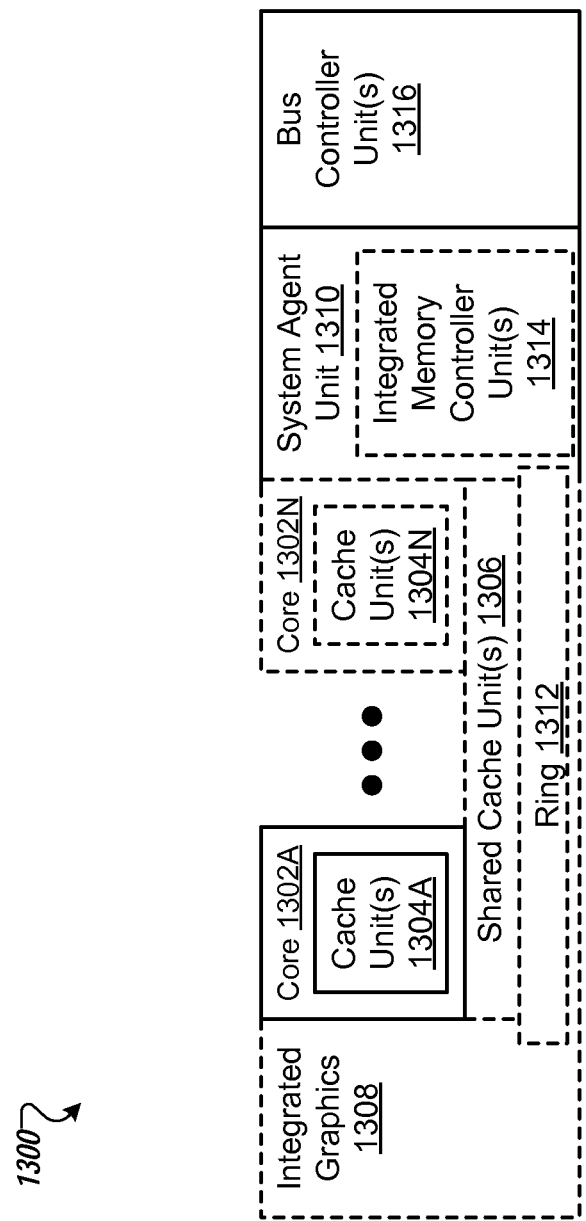
FIG. 13 is a block diagram of a single core processor and a multicore processor with integrated memory controller and graphics according to embodiments.

FIG. 13 is a block diagram of a single core processor and a multicore processor 1300 with integrated memory controller and graphics according to embodiments of the disclosure. The solid lined boxes in FIG. 13 illustrate a processor 1300 with a single core 1302A, a system agent 1310, a set of one or more bus controller units 1316, while the addition of the dashed lined boxes illustrates an alternative processor 1300 with multiple cores 1302A-N, a set of one or more integrated memory controller unit(s) 1314 in the system agent unit 1310, and an integrated graphics logic 1308.

The memory hierarchy includes one or more levels of cache within the cores, a set or one or more shared cache units 1306, and external memory (not shown) coupled to the set of integrated memory controller units 1314. The set of shared cache units 1306 may include one or more mid-level caches, such as level 2 (L2), level 3 (L3), level 4 (L4), or other levels of cache, a last level cache (LLC), and/or combinations thereof. While in one embodiment a ring based interconnect unit 1312 interconnects the integrated graphics logic 1308, the set of shared cache units 1306, and the system agent unit 1310, alternative embodiments may use any number of well-known techniques for interconnecting such units.

In some embodiments, one or more of the cores 1302A-N are capable of multithreading.

The system agent 1310 includes those components coordinating and operating cores 1302A-N. The system agent unit 1310 may include for example a power control unit (PCU) and a display unit. The PCU may be or include logic and components needed for regulating the power state of the cores 1302A-N and the integrated graphics logic 1308. The display unit is for driving one or more externally connected displays.

The cores 1302A-N may be homogenous or heterogeneous in terms of architecture and/or instruction set. For example, some of the cores 1302A-N may be in order while others are out-of-order. As another example, two or more of the cores 1302A-N may be capable of execution the same instruction set, while others may be capable of executing a subset of that instruction set or a different instruction set. As a further example, the cores can be different architecture.

The processor may include one or more different general-purpose processors, such as a Core™ i3, i5, i7, 2 Duo and Quad, Xeon™, Itanium™, Atom™, XScale™ or StrongARM™ processor, which are available from Intel Corporation, of Santa Clara, Calif. For example, one core can be a Core i7™ core while another core of the processor can be an Atom™ core. Alternatively, the processor may be from another company, such as ARM Holdings, Ltd, MIPS, etc. The processor may be a special-purpose processor, such as, for example, a network or communication processor, compression engine, graphics processor, co-processor, embedded processor, or the like. The processor may be implemented on one or more chips. The processor 800 may be a part of and/or may be implemented on one or more substrates using any of a number of process technologies, such as, for example, BiCMOS, CMOS, or NMOS.

Figure 14:
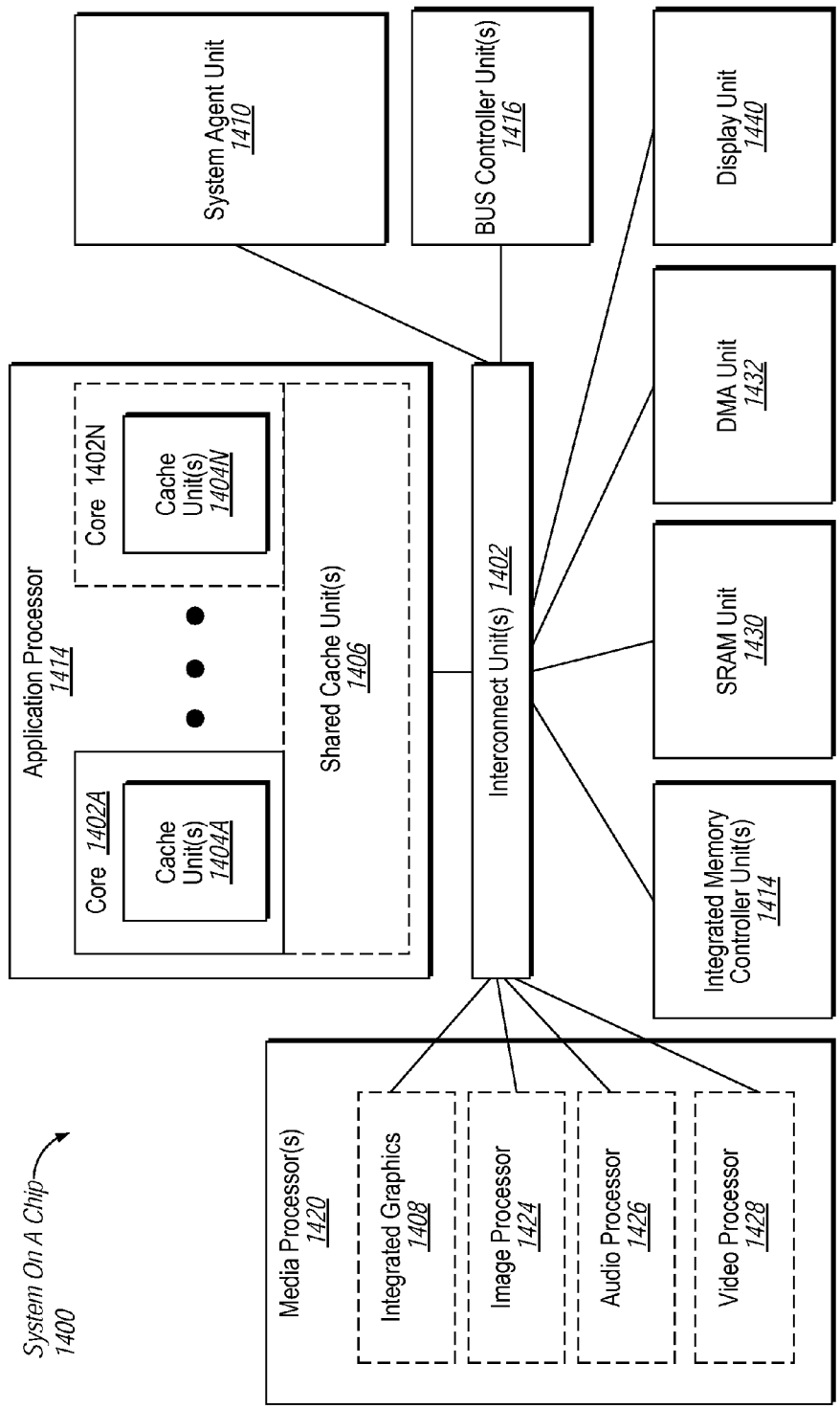
FIG. 14 illustrates a diagrammatic representation of a machine in the example form of a computing system according to embodiments.

FIG. 14 illustrates a diagrammatic representation of a machine in the example form of a computing system 1400 within which a set of instructions, for causing the machine to perform any one or more of the methodologies discussed herein, may be executed. In alternative embodiments, the machine may be connected (e.g., networked) to other machines in a LAN, an intranet, an extranet, or the Internet. The machine may operate in the capacity of a server or a client device in a client-server network environment, or as a peer machine in a peer-to-peer (or distributed) network environment. The machine may be a personal computer (PC), a tablet PC, a set-top box (STB), a Personal Digital Assistant (PDA), a game console, a cellular telephone, a digital camera, a handheld PC, a web appliance, a server, a network router, switch or bridge, micro controller, a digital signal processor (DSP), system on a chip, network computers (NetPC), network hubs, wide area network (WAN) switches, or any machine capable of executing a set of instructions (sequential or otherwise) that specify actions to be taken by that machine. Further, while only a single machine is illustrated for the processing device 100, the term "machine" shall also be taken to include any collection of machines that individually or jointly execute a set (or multiple sets) of instructions to perform any one or more of the methodologies discussed herein. Embodiments are not limited to computer systems.

The computing system 1400 includes a processing device 1402, main memory 1404 (e.g., read-only memory (ROM), flash memory, dynamic random access memory (DRAM) (such as synchronous DRAM (SDRAM) or DRAM (RDRAM), etc.), a static memory 1406 (e.g., flash memory, static random access memory (SRAM), etc.), and a data storage device 1416, which communicate with each other via a bus 1408.

Processing device 1402 represents one or more general-purpose processing devices such as a microprocessor, central processing unit, or the like. More particularly, the processing device may be complex instruction set computing (CISC) microprocessor, reduced instruction set computer (RISC) microprocessor, very long instruction word (VLIW) microprocessor, or processor implementing other instruction sets, or processors implementing a combination of instruction sets. Processing device 1402 may also be one or more special-purpose processing devices such as an application specific integrated circuit (ASIC), a field programmable gate array (FPGA), a digital signal processor (DSP), network processor, or the like. In one embodiment, processing device 1402 may include one or processing cores. The processing device 1402 is configured to execute the processing logic 1426 for performing the operations discussed herein. In one embodiment, processing device 1402 can be part of the system 100 of FIG. 1. Alternatively, the computing system 1400 can include other components as described herein. It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

Computing system 1400 is representative of processing systems based on the PENTIUM III™, PENTIUM 4™, Celeron™, Xeon™, Itanium, XScale™, StrongARM™, Core™, Core 2™, Atom™, and/or Intel® Architecture Core™, such as an i3, i5, i7 microprocessors available from Intel Corporation of Santa Clara, Calif., although other systems (including PCs having other microprocessors, engineering workstations, set-top boxes and the like) may also be used. However, understand that other low power processors such as available from Advanced Micro Devices, Inc. (AMD) of Sunnyvale, Calif., a MIPS-based design from MIPS Technologies, Inc. of Sunnyvale, Calif., an ARM-based design licensed from ARM Holdings, Ltd. or customer thereof, or their licensees or adopters may instead be present in other embodiments such as an Apple A5/A6 processor, a Qualcomm Snapdragon processor, or TI OMAP processor. In one embodiment, processing device 101 executes a version of the WINDOWS™ operating system available from Microsoft Corporation of Redmond, Wash., although other operating systems (OS X, UNIX, Linux, Android, iOS, Symbian, for example), embedded software, and/or graphical user interfaces, may also be used. Thus, embodiments of the present disclosure are not limited to any specific combination of hardware circuitry and software. One embodiment may be described in the context of a single processor desktop or server system, but alternative embodiments may be included in a multiprocessor system. Computing system 1400 may be an example of a 'hub' system architecture.

The computing system 1400 may further include a network interface device 1422 communicably coupled to a network 1418. The computing system 1400 also may include a display device 1410 (e.g., a liquid crystal display (LCD) or a cathode ray tube (CRT)), an alphanumeric input device 1412 (e.g., a keyboard), a cursor control device 1414 (e.g., a mouse), a signal generation device 1420 (e.g., a speaker), or other peripheral devices. Furthermore, computing system 1400 may include a graphics processing unit (not illustrated), a video processing unit (not illustrated) and an audio processing unit (not illustrated). In another embodiment, the computing system 1400 may include a chipset (not illustrated), which refers to a group of integrated circuits, or chips, that are designed to work with the processing device 1402 and controls communications between the processing device 1402 and external devices. For example, the chipset may be a set of chips on a motherboard that links the processing device 1402 to very high-speed devices, such as main memory 1404 and graphic controllers, as well as linking the processing device 1402 to lower-speed peripheral buses of peripherals, such as USB, PCI or ISA buses.

The data storage device 1416 may include a computer-readable storage medium 1424 on which is stored instructions 1426 embodying any one or more of the methodologies of functions described herein. The instructions 1426 may also reside, completely or at least partially, within the main memory 1404 as instructions 1426 and/or within the processing device 1402 as processing logic 1426 during execution thereof by the computing system 1400; the main memory 1404 and the processing device 1402 also constituting computer-readable storage media.

The computer-readable storage medium 1424 may also be used to store instructions 1426 utilizing the processing device 1402, such as described with respect to FIG. 1, and/or a software library containing methods that call the above applications. While the computer-readable storage medium 1424 is shown in an example embodiment to be a single medium, the term "computer-readable storage medium" should be taken to include a single medium or multiple media (e.g., a centralized or distributed database, and/or associated caches and servers) that store the one or more sets of instructions. The term "computer-readable storage medium" shall also be taken to include any medium that is capable of storing, encoding or carrying a set of instruction for execution by the machine and that cause the machine to perform any one or more of the methodologies of the present embodiments. The term "computer-readable storage medium" shall accordingly be taken to include, but not be limited to, solid-state memories, and optical and magnetic media.

Referring now to FIG. 14, shown is a block diagram of a SoC 1400 in accordance with an embodiment of the present disclosure. Similar elements in FIG. 14 bear like reference numerals. Also, dashed lined boxes are features on more advanced SoCs. In FIG. 14, an interconnect unit(s) 1402 is coupled to: an application processor 1410 which includes a set of one or more cores 1402A-N and shared cache unit(s) 1406; a system agent unit 1410; a bus controller unit(s) 1416; an integrated memory controller unit(s) 1414; a set or one or more media processors 1420 which may include integrated graphics logic 1408, an image processor 1424 for providing still and/or video camera functionality, an audio processor 1426 for providing hardware audio acceleration, and a video processor 1428 for providing video encode/decode acceleration; an static random access memory (SRAM) unit 1430; a direct memory access (DMA) unit 1432; and a display unit 1440 for coupling to one or more external displays.

Figure 15:
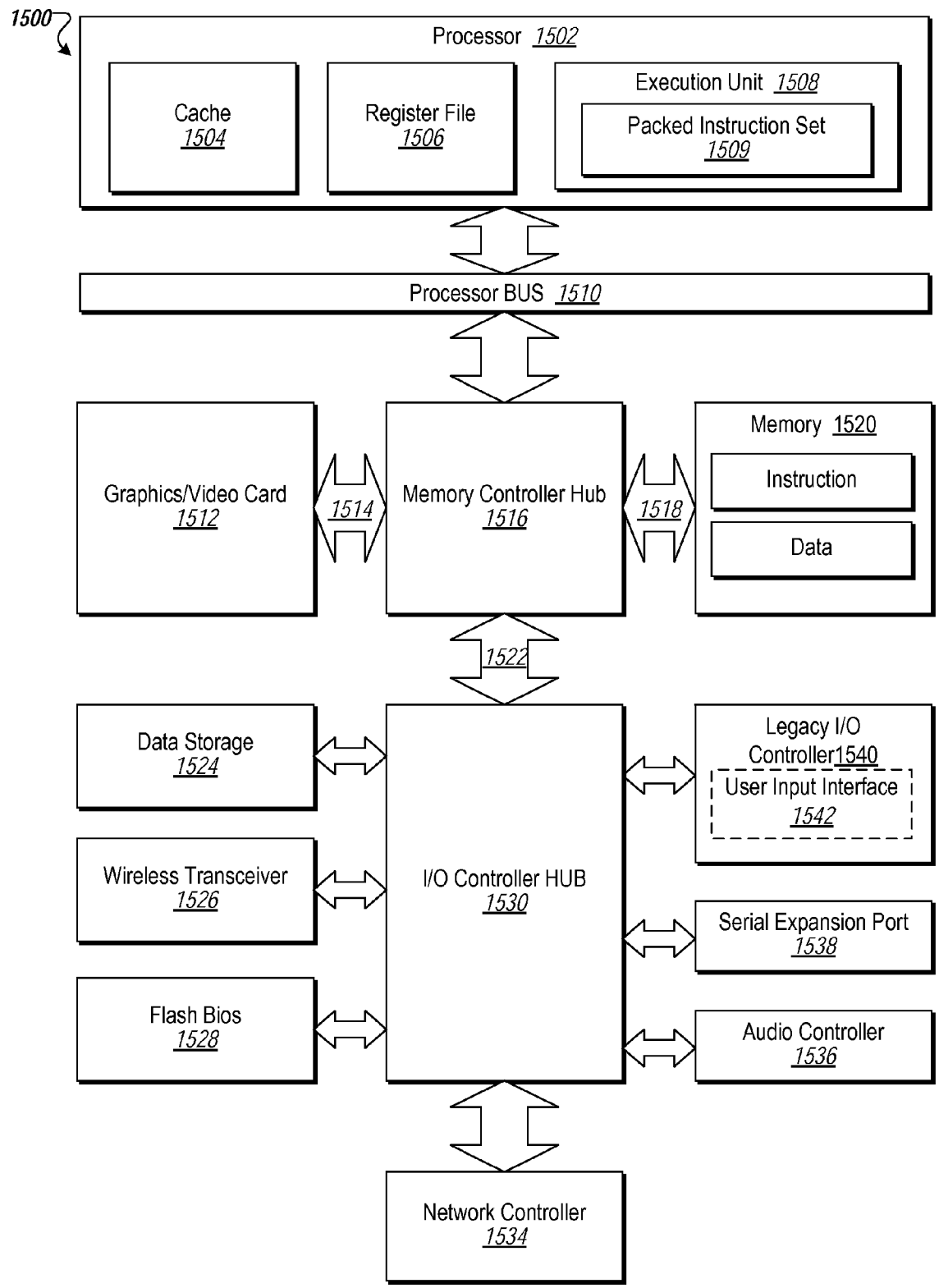
FIG. 15 illustrates a block diagram of an example computer system according to embodiments.

Turning to FIG. 15, a block diagram of an example computer system formed with a processor that includes execution units to execute an instruction, where one or more of the interconnects implement one or more features in accordance with one embodiment of the present disclosure is illustrated. System 1500 includes a component, such as a processor 1502 to employ execution units including logic to perform algorithms for processing data, in accordance with the embodiment described herein. Embodiments of the present disclosure are not limited to any specific combination of hardware circuitry and software.

Embodiments are not limited to computer systems. Alternative embodiments of the present disclosure can be used in other devices such as handheld devices and embedded applications. Some examples of handheld devices include cellular phones, Internet Protocol devices, digital cameras, personal digital assistants (PDAs), and handheld PCs. Embedded applications can include a micro controller, a digital signal processor (DSP), system on a chip, network computers (NetPC), set-top boxes, network hubs, wide area network (WAN) switches, or any other system that can perform one or more instructions in accordance with at least one embodiment.

In this illustrated embodiment, processor 1502 includes one or more execution units 1508 to implement an algorithm that is to perform at least one instruction. One embodiment may be described in the context of a single processor desktop or server system, but alternative embodiments may be included in a multiprocessor system. System 1500 is an example of a 'hub' system architecture. The computer system 1500 includes a processor 1502 to process data signals. The processor 1502, as one illustrative example, includes a complex instruction set computer (CISC) microprocessor, a reduced instruction set computing (RISC) microprocessor, a very long instruction word (VLIW) microprocessor, a processor implementing a combination of instruction sets, or any other processor device, such as a digital signal processor, for example. The processor 1502 is coupled to a processor bus 1510 that transmits data signals between the processor 1502 and other components in the system 1500. The elements of system 1500 (e.g. graphics accelerator 1512, memory controller hub 1516, memory 1520, I/O controller hub 1524, wireless transceiver 1526, Flash BIOS 1528, Network controller 1534, Audio controller 1536, Serial expansion port 1538, I/O controller 1530, etc.) perform their conventional functions that are well known to those familiar with the art.

In one embodiment, the processor 1502 includes a Level 1 (L1) internal cache memory 1504. Depending on the architecture, the processor 1502 may have a single internal cache or multiple levels of internal caches. Other embodiments include a combination of both internal and external caches depending on the particular embodiment and needs. Register file 1506 is to store different types of data in various registers including integer registers, floating point registers, vector registers, banked registers, shadow registers, checkpoint registers, status registers, and instruction pointer register.

Execution unit 1508, including logic to perform integer and floating point operations, also resides in the processor 1502. The processor 1502, in one embodiment, includes a microcode (ucode) ROM to store microcode, which when executed, is to perform algorithms for certain macroinstructions or handle complex scenarios. Here, microcode is potentially updateable to handle logic bugs/fixes for processor 1502. For one embodiment, execution unit 1508 includes logic to handle a packed instruction set 1509. By including the packed instruction set 1509 in the instruction set of a general-purpose processor 1502, along with associated circuitry to execute the instructions, the operations used by many multimedia applications may be performed using packed data in a general-purpose processor 1502. Thus, many multimedia applications are accelerated and executed more efficiently by using the full width of a processor's data bus for performing operations on packed data. This potentially eliminates the need to transfer smaller units of data across the processor's data bus to perform one or more operations, one data element at a time.

Alternate embodiments of an execution unit 1508 may also be used in micro controllers, embedded processors, graphics devices, DSPs, and other types of logic circuits. System 1500 includes a memory 1520. Memory 1520 includes a dynamic random access memory (DRAM) device, a static random access memory (SRAM) device, flash memory device, or other memory device. Memory 1520 also may include any type of persistent or non-volatile media, such as a flash memory device, a solid-state device (SSD), a memristor, phase change memory (e.g., PCS, PCM, PCME, PCRAM, Ovonic Unified Memory, Chalcogenide RAM, C-RAM, etc.), or other storage or memory device. The memory 1520 can be byte-addressable. Memory 1520 may also include volatile memory, such as in the form of random access memory (RAM) or registers. Memory 1520 stores instructions and/or data represented by data signals that are to be executed by the processor 1502.

A system logic chip 1516 is coupled to the processor bus 1510 and memory 1520. The system logic chip 1516 in the illustrated embodiment is a memory controller hub (MCH). The processor 1502 can communicate to the MCH 1516 via a processor bus 1510. The MCH 1516 provides a high bandwidth memory path 1518 to memory 1520 for instruction and data storage and for storage of graphics commands, data and textures. The MCH 1516 is to direct data signals between the processor 1502, memory 1520, and other components in the system 1500 and to bridge the data signals between processor bus 1510, memory 1520, and system I/O 1522. In some embodiments, the system logic chip 1516 can provide a graphics port for coupling to a graphics controller 1512. The MCH 1516 is coupled to memory 1520 through a memory interface 1518. The graphics card 1512 is coupled to the MCH 1516 through an Accelerated Graphics Port (AGP) interconnect 1514.

System 1500 can use a proprietary hub interface bus 1522 to couple the MCH 1516 to the I/O controller hub (ICH) 1530. The ICH 1530 provides direct connections to some I/O devices via a local I/O bus. The local I/O bus is a high-speed I/O bus for connecting peripherals to the memory 1520, chipset, and processor 1502. Some examples are the audio controller, firmware hub (flash BIOS) 1528, wireless transceiver 1526, data storage 1524, legacy I/O controller 1540 containing user input and keyboard interfaces 1542, a serial expansion port such as Universal Serial Bus (USB), and a network controller 1534. The data storage device 1524 can comprise a hard disk drive, a floppy disk drive, a CD-ROM device, a flash memory device, or other mass storage device.

For another embodiment of a system, an instruction in accordance with one embodiment can be used with a system on a chip. One embodiment of a system on a chip comprises of a processor and a memory. The memory for one such system is a flash memory. The flash memory can be located on the same die as the processor and other system components. Additionally, other logic blocks such as a memory controller or graphics controller can also be located on a system on a chip.

FIG. 16A is a block diagram illustrating an in-order pipeline and a register renaming stage, out-of-order issue/execution pipeline according to at least one embodiment of the disclosure. FIG. 16B is a block diagram illustrating an in-order architecture core and a register renaming logic, out-of-order issue/execution logic to be included in a processor according to at least one embodiment of the disclosure. The solid lined boxes in FIG. 16A illustrate the in-order pipeline, while the dashed lined boxes illustrates the register renaming, out-of-order issue/execution pipeline. Similarly, the solid lined boxes in FIG. 16B illustrate the in-order architecture logic, while the dashed lined boxes illustrates the register renaming logic and out-of-order issue/execution logic.

In FIG. 16A, a processor pipeline 1600 includes a fetch stage 1602, a length decode stage 1604, a decode stage 1606, an allocation stage 1608, a renaming stage 1610, a scheduling (also known as a dispatch or issue) stage 1612, a register read/memory read stage 1614, an execute stage 1616, a write back/memory write stage 1618, an exception handling stage 1622, and a commit stage 1624.

In FIG. 16B, arrows denote a coupling between two or more units and the direction of the arrow indicates a direction of data flow between those units. FIG. 16B shows processor core 1690 including a front end unit 1630 coupled to an execution engine unit 1650, and both are coupled to a memory unit 1670.

The core 1690 may be a reduced instruction set computing (RISC) core, a complex instruction set computing (CISC) core, a very long instruction word (VLIW) core, or a hybrid or alternative core type. As yet another option, the core 1690 may be a special-purpose core, such as, for example, a network or communication core, compression engine, graphics core, or the like.

The front end unit 1630 includes a branch prediction unit 1632 coupled to an instruction cache unit 1634, which is coupled to an instruction translation lookaside buffer (TLB) 1636, which is coupled to an instruction fetch unit 1638, which is coupled to a decode unit 1640. The decode unit or decoder may decode instructions, and generate as an output one or more micro-operations, micro-code entry points, microinstructions, other instructions, or other control signals, which are decoded from, or which otherwise reflect, or are derived from, the original instructions. The decoder may be implemented using various different mechanisms. Examples of suitable mechanisms include, but are not limited to, look-up tables, hardware implementations, programmable logic arrays (PLAs), microcode read only memories (ROMs), etc. The instruction cache unit 1634 is further coupled to a level 2 (L2) cache unit 1676 in the memory unit 1670. The decode unit 1640 is coupled to a rename/allocator unit 1652 in the execution engine unit 1650.

The execution engine unit 1650 includes the rename/allocator unit 1652 coupled to a retirement unit 1654 and a set of one or more scheduler unit(s) 1656. The scheduler unit(s) 1656 represents any number of different schedulers, including reservations stations, central instruction window, etc. The scheduler unit(s) 1656 is coupled to the physical register file(s) unit(s) 1658. Each of the physical register file(s) units 1658 represents one or more physical register files, different ones of which store one or more different data types, such as scalar integer, scalar floating point, packed integer, packed floating point, vector integer, vector floating point, status (e.g., an instruction pointer that is the address of the next instruction to be executed), etc. The physical register file(s) unit(s) 1658 is overlapped by the retirement unit 1654 to illustrate various ways in which register renaming and out-of-order execution may be implemented (e.g., using a reorder buffer(s) and a retirement register file(s), using a future file(s), a history buffer(s), and a retirement register file(s); using a register maps and a pool of registers; etc.). Generally, the architectural registers are visible from the outside of the processor or from a programmer's perspective. The registers are not limited to any known particular type of circuit. Various different types of registers are suitable as long as they are capable of storing and providing data as described herein. Examples of suitable registers include, but are not limited to, dedicated physical registers, dynamically allocated physical registers using register renaming, combinations of dedicated and dynamically allocated physical registers, etc. The retirement unit 1654 and the physical register file(s) unit(s) 1658 are coupled to the execution cluster(s) 1660. The execution cluster(s) 1660 includes a set of one or more execution units 1662 and a set of one or more memory access units 1664. The execution units 1662 may perform various operations (e.g., shifts, addition, subtraction, multiplication) and on various types of data (e.g., scalar floating point, packed integer, packed floating point, vector integer, vector floating point). While some embodiments may include a number of execution units dedicated to specific functions or sets of functions, other embodiments may include one execution unit or multiple execution units that all perform all functions. The scheduler unit(s) 1656, physical register file(s) unit(s) 1658, and execution cluster(s) 1660 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster—and in the case of a separate memory access pipeline, certain embodiments are implemented in which the execution cluster of this pipeline has the memory access unit(s) 1664). It should also be understood that where separate pipelines are used, one or more of these pipelines may be out-of-order issue/execution and the rest in-order.

The set of memory access units 1664 is coupled to the memory unit 1670, which includes a data TLB unit 1672 coupled to a data cache unit 1674 coupled to a level 2 (L2) cache unit 1676. In one exemplary embodiment, the memory access units 1664 may include a load unit, a store address unit, and a store data unit, each of which is coupled to the data TLB unit 1672 in the memory unit 1670. The L2 cache unit 1676 is coupled to one or more other levels of cache and eventually to a main memory.

By way of example, the register renaming, out-of-order issue/execution core architecture may implement the pipeline 1600 as follows: 1) the instruction fetch 1638 performs the fetch and length decoding stages 1602 and 1604; 2) the decode unit 1640 performs the decode stage 1606; 3) the rename/allocator unit 1652 performs the allocation stage 1608 and renaming stage 1610; 4) the scheduler unit(s) 1656 performs the schedule stage 1612; 5) the physical register file(s) unit(s) 1658 and the memory unit 1670 perform the register read/memory read stage 1614; the execution cluster 16160 perform the execute stage 1616; 6) the memory unit 1670 and the physical register file(s) unit(s) 1658 perform the write back/memory write stage 1618; 7) various units may be involved in the exception handling stage 1622; and 16) the retirement unit 1654 and the physical register file(s) unit(s) 1658 perform the commit stage 1624.

The core 1690 may support one or more instructions sets (e.g., the x166 instruction set (with some extensions that have been added with newer versions); the MIPS instruction set of MIPS Technologies of Sunnyvale, Calif.; the ARM instruction set (with additional extensions such as NEON) of ARM Holdings of Sunnyvale, Calif.).

While register renaming is described in the context of out-of-order execution, it should be understood that register renaming may be used in an in-order architecture. While the illustrated embodiment of the processor also includes a separate instruction and data cache units 1634/1674 and a shared L2 cache unit 1676, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

While the present disclosure has been described with respect to a limited number of embodiments, those skilled in the art will appreciate numerous modifications and variations therefrom. It is intended that the appended claims cover all such modifications and variations as fall within the true spirit and scope of this present disclosure.

In the description herein, numerous specific details are set forth, such as examples of specific types of processors and system configurations, specific hardware structures, specific architectural and micro architectural details, specific register configurations, specific instruction types, specific system components, specific measurements/heights, specific processor pipeline stages and operation etc. in order to provide a thorough understanding of the present disclosure. It will be apparent, however, to one skilled in the art that these specific details need not be employed to practice the present disclosure. In other instances, well known components or methods, such as specific and alternative processor architectures, specific logic circuits/code for described algorithms, specific firmware code, specific interconnect operation, specific logic configurations, specific manufacturing techniques and materials, specific compiler implementations, specific expression of algorithms in code, specific power down and gating techniques/logic and other specific operational details of computer system have not been described in detail in order to avoid unnecessarily obscuring the present disclosure.

The embodiments are described with reference to hybrid-threading in specific integrated circuits, such as in computing platforms or microprocessors. The embodiments may also be applicable to other types of integrated circuits and programmable logic devices. For example, the disclosed embodiments are not limited to desktop computer systems or portable computers, such as the Intel® Ultrabooks™ computers. And may be also used in other devices, such as handheld devices, tablets, other thin notebooks, systems on a chip (SOC) devices, and embedded applications. Some examples of handheld devices include cellular phones, Internet protocol devices, digital cameras, personal digital assistants (PDAs), and handheld PCs. Embedded applications typically include a microcontroller, a digital signal processor (DSP), a system on a chip, network computers (NetPC), set-top boxes, network hubs, wide area network (WAN) switches, or any other system that can perform the functions and operations taught below. It is described that the system can be any kind of computer or embedded system. The disclosed embodiments may especially be used for low-end devices, like wearable devices (e.g., watches), electronic implants, sensory and control infrastructure devices, controllers, supervisory control and data acquisition (SCADA) systems, or the like. Moreover, the apparatuses, methods, and systems described herein are not limited to physical computing devices, but may also relate to software optimizations for energy conservation and efficiency. As will become readily apparent in the description below, the embodiments of methods, apparatuses, and systems described herein (whether in reference to hardware, firmware, software, or a combination thereof) are vital to a 'green technology' future balanced with performance considerations.

Although the embodiments herein are described with reference to a processor, other embodiments are applicable to other types of integrated circuits and logic devices. Similar techniques and teachings of embodiments of the present disclosure can be applied to other types of circuits or semiconductor devices that can benefit from higher pipeline throughput and improved performance. The teachings of embodiments of the present disclosure are applicable to any processor or machine that performs data manipulations. However, the present disclosure is not limited to processors or machines that perform 512 bit, 256 bit, 128 bit, 64 bit, 32 bit, or 16 bit data operations and can be applied to any processor and machine in which manipulation or management of data is performed. In addition, the description herein provides examples, and the accompanying drawings show various examples for the purposes of illustration. However, these examples should not be construed in a limiting sense as they are merely intended to provide examples of embodiments of the present disclosure rather than to provide an exhaustive list of all possible implementations or embodiments of the present disclosure.

Although the below examples describe instruction handling and distribution in the context of execution units and logic circuits, other embodiments of the present disclosure can be accomplished by way of a data or instructions stored on a machine-readable, tangible medium, which when performed by a machine cause the machine to perform functions consistent with at least one embodiment of the disclosure. In one embodiment, functions associated with embodiments of the present disclosure are embodied in machine-executable instructions. The instructions can be used to cause a general-purpose or special-purpose processor that is programmed with the instructions to perform the steps of the present disclosure. Embodiments of the present disclosure may be provided as a computer program product or software which may include a machine or computer-readable medium having stored thereon instructions which may be used to program a computer (or other electronic devices) to perform one or more operations according to embodiments of the present disclosure. Alternatively, operations of embodiments of the present disclosure might be performed by specific hardware components that contain fixed-function logic for performing the operations, or by any combination of programmed computer components and fixed-function hardware components.

Instructions used to program logic to perform embodiments of the disclosure can be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

A design may go through various stages, from creation to simulation to fabrication. Data representing a design may represent the design in a number of manners. First, as is useful in simulations, the hardware may be represented using a hardware description language or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the present disclosure.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Use of the phrase 'configured to,' in one embodiment, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'to,' 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The following examples pertain to further embodiments.

Example 1 is an integrated circuit including a memory device including a first portion and a second portion, where the first portion is a first type of content addressable memory (CAM) with a first set of cells and the second portion is a second type of CAM with a second set of cells, where the first set of cells is smaller than the second set of cells, a decompression accelerator coupled to the memory device, the decompression accelerator to generate a plurality of length codes, where each of the plurality of length codes comprise at least one bit, where the plurality of length codes are generated using a symbol received from an encoded data stream that includes a plurality of symbols, and store the plurality of length codes in the first portion of the memory device in an order according to their respective number of bits.

In Example 2, the subject matter of Example 1, where the memory device includes a 15-bit array, where the first portion includes a 9-bit array and where the second portion includes a 6-bit array.

In Example 3, the subject matter of any one of Examples 1-2 further including a core coupled to the decompression accelerator, the core to decode the plurality of length codes for a decoded data stream.

In Example 4, the subject matter of any one of Examples 1-3, where the first portion of the memory device includes an array of a first length, where the second portion of the memory device includes an array of a second length, where a total length of the memory device is equal to at least a sum of the first length and the second length.

In Example 5, the subject matter of any one of Examples 1-4, where when decoding the plurality of length codes, the core is to identify a block of data of the encoded data stream, cause a lookup operation for the block of data in the memory device, and receive a decoded block of data from a register file that is associated with the memory device.

In Example 6, the subject matter of any one of Examples 1-5, where the first portion of the memory device includes a plurality of partitions, where the register file is divided into a number of parts equal to the number of the plurality of partitions, where each partition is to store one of the parts of the register file, where when causing the lookup operation for the block of data in the memory device, the core is to cause a lookup operation for the block of data in each of the plurality of partitions of the first portion of the memory device, where a match for the lookup operation corresponds to a row in a one of the parts of the register file.

In Example 7, the subject matter of any one of Examples 1-6, where the first set of cells is smaller in physical size than the second set of cells.

In Example 8, the subject matter of any one of Examples 1-7, where the first set of cells has a smaller data capacity than the second set of cells.

In Example 9, the subject matter of any one of Examples 1-8, where the first set of first cells includes a plurality of first cells and the second set of cells includes a plurality of second cells, where each of the plurality of first cells is a binary cell and where each of the plurality of second cells is a ternary cell.

In Example 10, the subject matter of any one of Examples 1-9, where the first portion of the memory device includes a register file to store decompressed data associated with the encoded data stream.

In Example 11, the subject matter of any one of Examples 1-10, where the memory device is to store a shift value to indicate a shift amount value, where the shift value is determined using a number of bits in a code length and a number of bits that were consumed by the decompression accelerator.

Example 12 is a method including receiving, by a processing device, a first data block of a compressed data stream, the first data block having an associated first header, parsing the first header of the first data block to identify a first code length of the first data block, generating, by the processing device, a first address for the first data block, storing the first data block in a content addressable memory (CAM) in association with the first address, the CAM including a first portion that includes a first set of cells and a second portion that includes a second set of cells, where the first set of cells is smaller than the second set of cells, receiving a second data block of the compressed data stream, the second data block having an associated second header, generating, by the processing device, a second address for the second data block based on a second code length in the second header, and storing the second data block in the first portion of the CAM in an order with respect to the first code length and the second code length.

In Example 13, the subject matter of Examples 12, where the first code length and the second code length are stored in the first portion of the CAM in an increasing order of code length.

In Example 14, the subject matter of any one of Examples 12-13, where the first code length is stored in association with a first counter having a first counter length, where the second code length is stored in association with a second counter having a second counter length.

In Example 15, the subject matter of any one of Examples 12-14 further including: receiving a third data block of the compressed data stream, the third data block having an associated third header, generating, by the processing device, a third address for the third data block based on a third code length in the third header, and storing the third data block in the first portion of the CAM in an order with respect to the first code length, the second code length, and the third code length.

In Example 16, the subject matter of any one of Examples 12-15 further including receiving a symbol associated with the data stream, performing a lookup operation for a match to the symbol in the first portion of the CAM, upon identifying a match to the symbol in the first portion of the CAM, identifying a corresponding row in a register file, and providing data from the corresponding row in the register file in an output data stream.

In Example 17, the subject matter of any one of Examples 12-16 further including receiving a symbol associated with the data stream, performing a lookup operation for a match to the symbol in the first portion of the CAM, and when the lookup operation does not yield a match to the symbol in the first portion of the CAM, performing the lookup operation in the second portion of the CAM.

Example 18 is a non-transitory machine-readable storage medium including data that, when accessed by a processing device, cause the processing device to perform operations including receiving, by the processing device, a first data block of a compressed data stream, the first data block having an associated first header, parsing the first header of the first data block to identify a first code length of the first data block, generating, by the processing device, a first address for the first data block, storing the first data block in a content addressable memory (CAM) in association with the first address, the CAM including a first portion that includes a first set of cells and a second portion that includes a second set of cells, where the first set of cells are smaller than the second set of cells, receiving a second data block of the compressed data stream, the second data block having an associated second header, generating, by the processing device, a second address for the second data block based on a second code length in the second header, and storing the second data block in the first portion of the CAM in an order with respect to the first code length and the second code length.

In Example 19, the subject matter of Examples 18, where the first code length and the second code length are stored in the first portion of the CAM in an increasing order of code length.

In Example 20, the subject matter of any one of Examples 18-19, the operations further including receiving a third data block of the compressed data stream, the third data block having an associated third header, generating, by the processing device, a third address for the third data block based on a third code length in the third header, and storing the third data block in the first portion of the CAM in an order with respect to the first code length, the second code length, and the third code length.

In Example 21, the subject matter of any one of Examples 18-20, the operations further including receiving a symbol associated with the data stream, performing a lookup operation for a match to the symbol in the first portion of the CAM, upon identifying a match to the symbol in the first portion of the CAM, identifying a corresponding row in a register file, and providing data from the corresponding row in the register file in an output data stream.

In Example 22, the subject matter of any one of Examples 18-21, where the first set of cells has a smaller data capacity than the second set of cells.

Example 23 is a method including generating, by a processing device, a plurality of length codes, where each of the plurality of length codes comprise at least one bit, where the plurality of length codes are generated using a symbol received from an encoded data stream that includes a plurality of symbols, and storing the plurality of length codes in a memory device in an order according to their respective number of bits, the memory device including a first portion and a second portion, where the first portion is a first type of content addressable memory (CAM) with a first set of cells and the second portion is a second type of CAM with a second set of cells, where the plurality of length codes are to be stored in the first portion, where the first set of cells is smaller than the second set of cells.

In Example 24, the subject matter of Example 23, where the memory device includes a 15-bit array, where the first portion includes a 9-bit array and where the second portion includes a 6-bit array.

In Example 25, the subject matter of any one of Examples 23-24 further including decoding the plurality of length codes for a decoded data stream.

In Example 26, the subject matter of any one of Examples 23-25, where the first portion of the memory device includes an array of a first length, where the second portion of the memory device includes an array of a second length, where a total length of the memory device is equal to at least a sum of the first length and the second length.

In Example 27, the subject matter of any one of Examples 23-26, where decoding the plurality of length codes includes identifying a block of data of the encoded data stream, causing a lookup operation for the block of data in the memory device, and receiving a decoded block of data from a register file that is associated with the memory device.

In Example 28, the subject matter of any one of Examples 23-27, where the first portion of the memory device includes a plurality of partitions, where the register file is divided into a number of parts equal to the number of the plurality of partitions, where each partition is to store one of the parts of the register file, where causing the lookup operation for the block of data in the memory device, includes causing a lookup operation for the block of data in each of the plurality of partitions of the first portion of the memory device, where a match for the lookup operation corresponds to a row in a one of the parts of the register file.

In Example 29, the subject matter of any one of Examples 23-28, where the first set of cells is smaller in physical size than the second set of cells.

In Example 30, the subject matter of any one of Examples 23-29, where the first set of cells has a smaller data capacity than the second set of cells.

In Example 31, the subject matter of any one of Examples 23-30, where the first set of first cells includes a plurality of first cells and the second set of cells includes a plurality of second cells, where each of the plurality of first cells is a binary cell and where each of the plurality of second cells is a ternary cell.

In Example 32, the subject matter of any one of Examples 23-31, where the first portion of the memory device includes a register file to store decompressed data associated with the encoded data stream.

In Example 33, the subject matter of any one of Examples 23-32 further including storing a shift value to indicate a shift amount value, where the shift value is determined using a number of bits in a code length and a number of bits that were consumed by the processing device.

Example 34 is a machine-readable storage medium including data that, when executed by a processor, cause the processor to perform operations including generating, by the processor, a plurality of length codes, where each of the plurality of length codes comprise at least one bit, where the plurality of length codes are generated using a symbol received from an encoded data stream that includes a plurality of symbols, and storing the plurality of length codes in a memory device in an order according to their respective number of bits, the memory device including a first portion and a second portion, where the first portion is a first type of content addressable memory (CAM) with a first set of cells and the second portion is a second type of CAM with a second set of cells, where the plurality of length codes are to be stored in the first portion, where the first set of cells is smaller than the second set of cells.

In Example 35, the subject matter of Example 34, where the memory device includes a 15-bit array, where the first portion includes a 9-bit array and where the second portion includes a 6-bit array.

In Example 36, the subject matter of any one of Examples 34-35 further including decoding the plurality of length codes for a decoded data stream.

In Example 37, the subject matter of any one of Examples 34-36 where the first portion of the memory device includes an array of a first length, where the second portion of the memory device includes an array of a second length, where a total length of the memory device is equal to at least a sum of the first length and the second length.

In Example 38, the subject matter of any one of Examples 34-37 where decoding the plurality of length codes includes identifying a block of data of the encoded data stream, causing a lookup operation for the block of data in the memory device, and receiving a decoded block of data from a register file that is associated with the memory device.

In Example 39, the subject matter of any one of Examples 34-38, where the first portion of the memory device includes a plurality of partitions, where the register file is divided into a number of parts equal to the number of the plurality of partitions, where each partition is to store one of the parts of the register file, where causing the lookup operation for the block of data in the memory device, includes causing a lookup operation for the block of data in each of the plurality of partitions of the first portion of the memory device, where a match for the lookup operation corresponds to a row in a one of the parts of the register file.

In Example 40, the subject matter of any one of Examples 34-39, where the first set of cells is smaller in physical size than the second set of cells.

In Example 41, the subject matter of any one of Examples 34-40, where the first set of cells has a smaller data capacity than the second set of cells.

In Example 42, the subject matter of any one of Examples 34-41, where the first set of first cells includes a plurality of first cells and the second set of cells includes a plurality of second cells, where each of the plurality of first cells is a binary cell and where each of the plurality of second cells is a ternary cell.

In Example 43, the subject matter of any one of Examples 33-42, where the first portion of the memory device includes a register file to store decompressed data associated with the encoded data stream.

In Example 44, the subject matter of any one of Examples 33-43 further including storing a shift value to indicate a shift amount value, where the shift value is determined using a number of bits in a code length and a number of bits that were consumed by the processing device.

Example 45 is an apparatus including means for generating, by a processing device, a plurality of length codes, where each of the plurality of length codes comprise at least one bit, where the plurality of length codes are generated using a symbol received from an encoded data stream that includes a plurality of symbols, and means for storing the plurality of length codes in a memory device in an order according to their respective number of bits, the memory device including a first portion and a second portion, where the first portion is a first type of content addressable memory (CAM) with a first set of cells and the second portion is a second type of CAM with a second set of cells, where the plurality of length codes are to be stored in the first portion, where the first set of cells is smaller than the second set of cells.

In Example 46, the subject matter of Example 45, where the memory device includes a 15-bit array, where the first portion includes a 9-bit array and where the second portion includes a 6-bit array.

In Example 47, the subject matter of any one of Examples 45-46 further including means for decoding the plurality of length codes for a decoded data stream.

In Example 48, the subject matter of any one of Examples 45-47, where the first portion of the memory device includes an array of a first length, where the second portion of the memory device includes an array of a second length, where a total length of the memory device is equal to at least a sum of the first length and the second length.

In Example 49, the subject matter of any one of Examples 45-48, where the means for decoding the plurality of length codes includes means for identifying a block of data of the encoded data stream, means for causing a lookup operation for the block of data in the memory device, and means for receiving a decoded block of data from a register file that is associated with the memory device.

In Example 50, the subject matter of any one of Examples 45-49, where the first portion of the memory device includes a plurality of partitions, where the register file is divided into a number of parts equal to the number of the plurality of partitions, where each partition is to store one of the parts of the register file, where causing the lookup operation for the block of data in the memory device, includes causing a lookup operation for the block of data in each of the plurality of partitions of the first portion of the memory device, where a match for the lookup operation corresponds to a row in a one of the parts of the register file.

In Example 51, the subject matter of any one of Examples 45-50, where the first set of cells is smaller in physical size than the second set of cells.

In Example 52, the subject matter of any one of Examples 45-51, where the first set of cells has a smaller data capacity than the second set of cells.

In Example 53, the subject matter of any one of Examples 45-52, where the first set of first cells includes a plurality of first cells and the second set of cells includes a plurality of second cells, where each of the plurality of first cells is a binary cell and where each of the plurality of second cells is a ternary cell.

In Example 54, the subject matter of any one of Examples 45-53, where the first portion of the memory device includes a register file to store decompressed data associated with the encoded data stream.

In Example 55, the subject matter of any one of Examples 45-54, further including means for storing a shift value to indicate a shift amount value, where the shift value is determined using a number of bits in a code length and a number of bits that were consumed by the processing device.

Example 56 is an apparatus including means for receiving a first data block of a compressed data stream, the first data block having an associated first header, means for parsing the first header of the first data block to identify a first code length of the first data block, means for generating a first address for the first data block, means for storing the first data block in a content addressable memory (CAM) in association with the first address, the CAM including a first portion that includes a first set of cells and a second portion that includes a second set of cells, where the first set of cells is smaller than the second set of cells, means for receiving a second data block of the compressed data stream, the second data block having an associated second header, means for generating a second address for the second data block based on a second code length in the second header, and means for storing the second data block in the first portion of the CAM in an order with respect to the first code length and the second code length.

In Example 57, the subject matter of Example 56, where the first code length and the second code length are stored in the first portion of the CAM in an increasing order of code length.

In Example 58, the subject matter of any one of Examples 56-57, where the first code length is stored in association with a first counter having a first counter length, where the second code length is stored in association with a second counter having a second counter length.

In Example 59, the subject matter of any one of Examples 56-58 further including means for receiving a third data block of the compressed data stream, the third data block having an associated third header, means for generating a third address for the third data block based on a third code length in the third header, and means for storing the third data block in the first portion of the CAM in an order with respect to the first code length, the second code length, and the third code length.

In Example 60, the subject matter of any one of Examples 56-59 further including means for receiving a symbol associated with the data stream, performing a lookup operation for a match to the symbol in the first portion of the CAM, means for identifying a corresponding row in a register file upon identifying a match to the symbol in the first portion of the CAM, and means for providing data from the corresponding row in the register file in an output data stream.

In Example 61, the subject matter of any one of Examples 56-60 further including means for receiving a symbol associated with the data stream, means for performing a lookup operation for a match to the symbol in the first portion of the CAM, and means for performing the lookup operation in the second portion of the CAM when the lookup operation does not yield a match to the symbol in the first portion of the CAM.

Example 62 is a non-transitory machine-readable storage medium including data that, when accessed by a processing device, cause the processing device to perform operations including generating, by a processing device, a plurality of length codes, where each of the plurality of length codes comprise at least one bit, where the plurality of length codes are generated using a symbol received from an encoded data stream that includes a plurality of symbols, and storing the plurality of length codes in a memory device in an order according to their respective number of bits, the memory device including a first portion and a second portion, where the first portion is a first type of content addressable memory (CAM) with a first set of cells and the second portion is a second type of CAM with a second set of cells, where the plurality of length codes are to be stored in the first portion, where the first set of cells is smaller than the second set of cells.

In Example 63, the subject matter of Example 62 further including decoding the plurality of length codes for a decoded data stream.

Example 64 is a machine readable medium including code, when executed, to cause a machine to perform the method of any one of Examples 12 to 17.

Example 65 is a machine readable medium including code, when executed, to cause a machine to perform the method of any one of Examples 23 to 33.

Example 66 is an apparatus including means for performing the method of any one of Examples 12 to 17.

Example 67 is an apparatus including means for performing the method of any one of Examples 23 to 33.

Example 68 is an apparatus including a processor configured to perform the method of any one of Examples 12 to 17.

Example 69 is an apparatus including a processor configured to perform the method of any one of Examples 23 to 33.

Example 70 is a system including a peripheral device, a memory device including a first portion and a second portion, where the first portion is a first type of content addressable memory (CAM) with a first set of cells and the second portion is a second type of CAM with a second set of cells, where the first set of cells is smaller than the second set of cells, a decompression accelerator coupled to the memory device, the decompression accelerator to generate a plurality of length codes, where each of the plurality of length codes comprise at least one bit, where the plurality of length codes are generated using a symbol received from an encoded data stream that includes a plurality of symbols, and store the plurality of length codes in the first portion of the memory device in an order according to their respective number of bits.

Example 71 is a machine-readable storage including machine-readable instructions, when executed, to implement a method or realize an apparatus as claimed in any preceding Example.

The embodiments of methods, hardware, software, firmware or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash memory devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the present specification, a detailed description has been given with reference to specific example embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers or the like. The blocks described herein can be hardware, software, firmware or a combination thereof.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "defining," "receiving," "determining," "issuing," "linking," "associating," "obtaining," "authenticating," "prohibiting," "executing," "requesting," "communicating," "monitoring," "calculating," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such. Also, the terms "first," "second," "third," "fourth," etc. as used herein are meant as labels to distinguish among different elements and may not necessarily have an ordinal meaning according to their numerical designation.

What is claimed is:

1. An integrated circuit comprising:
   a memory device comprising a first portion and a second portion, wherein the first portion is a first type of content addressable memory (CAM) with a first set of cells and the second portion is a second type of CAM with a second set of cells, wherein the first set of cells is smaller than the second set of cells;
   a decompression accelerator coupled to the memory device, the decompression accelerator to:
      generate a plurality of length codes, wherein each of the plurality of length codes comprise at least one bit, wherein the plurality of length codes are generated using a symbol received from an encoded data stream that includes a plurality of symbols; and
      store the plurality of length codes in the first portion of the memory device in an order according to their respective number of bits; and
   a core coupled to the decompression accelerator, the core to decode the plurality of length codes for a decoded data stream.

2. The integrated circuit of claim 1, wherein the memory device comprises a 15-bit array, wherein the first portion comprises a 9-bit array and wherein the second portion comprises a 6-bit array.

3. The integrated circuit of claim 1, wherein the first portion of the memory device comprises an array of a first length, wherein the second portion of the memory device comprises an array of a second length, wherein a total length of the memory device is equal to at least a sum of the first length and the second length.

4. The integrated circuit of claim 3, wherein when decoding the plurality of length codes, the core is to:
identify a block of data of the encoded data stream;
cause a lookup operation for the block of data in the memory device; and
receive a decoded block of data from a register file that is associated with the memory device.

5. The integrated circuit of claim 4, wherein the first portion of the memory device comprises a plurality of partitions, wherein the register file is divided into a number of parts equal to the number of the plurality of partitions, wherein each partition is to store one of the parts of the register file, wherein when causing the lookup operation for the block of data in the memory device, the core is to cause a lookup operation for the block of data in each of the plurality of partitions of the first portion of the memory device, wherein a match for the lookup operation corresponds to a row in a one of the parts of the register file.

6. The integrated circuit of claim 1, wherein the first set of cells is smaller in physical size than the second set of cells.

7. The integrated circuit of claim 1, wherein the first set of cells has a smaller data capacity than the second set of cells.

8. The integrated circuit of claim 7, wherein the first set of first cells comprises a plurality of first cells and the second set of cells comprises a plurality of second cells, wherein each of the plurality of first cells is a binary cell and wherein each of the plurality of second cells is a ternary cell.

9. The integrated circuit of claim 1, wherein the first portion of the memory device comprises a register file to store decompressed data associated with the encoded data stream.

10. The integrated circuit of claim 1, wherein the memory device is to store a shift value to indicate a shift amount value, wherein the shift value is determined using a number of bits in a code length and a number of bits that were consumed by the decompression accelerator.

11. A method comprising:
receiving, by a processing device, a first data block of a compressed data stream, the first data block having an associated first header;
parsing the first header of the first data block to identify a first code length of the first data block;
generating, by the processing device, a first address for the first data block;
storing the first data block in a content addressable memory (CAM) in association with the first address, the CAM comprising a first portion that comprises a first set of cells and a second portion that comprises a second set of cells, wherein the first set of cells is smaller than the second set of cells;
receiving a second data block of the compressed data stream, the second data block having an associated second header;
generating, by the processing device, a second address for the second data block based on a second code length in the second header; and
storing the second data block in the first portion of the CAM in an order with respect to the first code length and the second code length.

12. The method of claim 11, wherein the first code length and the second code length are stored in the first portion of the CAM in an increasing order of code length.

13. The method of claim 11, wherein the first code length is stored in association with a first counter having a first counter length, wherein the second code length is stored in association with a second counter having a second counter length.

14. The method of claim 11 further comprising:
receiving a third data block of the compressed data stream, the third data block having an associated third header;
generating, by the processing device, a third address for the third data block based on a third code length in the third header; and
storing the third data block in the first portion of the CAM in an order with respect to the first code length, the second code length, and the third code length.

15. The method of claim 11 further comprising:
receiving a symbol associated with the data stream;
performing a lookup operation for a match to the symbol in the first portion of the CAM;
upon identifying a match to the symbol in the first portion of the CAM, identifying a corresponding row in a register file; and
providing data from the corresponding row in the register file in an output data stream.

16. The method of claim 11 further comprising:
receiving a symbol associated with the data stream;
performing a lookup operation for a match to the symbol in the first portion of the CAM; and
when the lookup operation does not yield a match to the symbol in the first portion of the CAM, performing the lookup operation in the second portion of the CAM.

17. A non-transitory machine-readable storage medium including data that, when accessed by a processing device, cause the processing device to perform operations comprising:
receiving, by the processing device, a first data block of a compressed data stream, the first data block having an associated first header;
parsing the first header of the first data block to identify a first code length of the first data block;
generating, by the processing device, a first address for the first data block;
storing the first data block in a content addressable memory (CAM) in association with the first address, the CAM comprising a first portion that comprises a first set of cells and a second portion that comprises a second set of cells, wherein the first set of cells are smaller than the second set of cells;
receiving a second data block of the compressed data stream, the second data block having an associated second header;
generating, by the processing device, a second address for the second data block based on a second code length in the second header; and
storing the second data block in the first portion of the CAM in an order with respect to the first code length and the second code length.

18. The non-transitory machine-readable storage medium of claim 17, wherein the first code length and the second code length are stored in the first portion of the CAM in an increasing order of code length.

19. The non-transitory machine-readable storage medium of claim 17, the operations further comprising:

receiving a third data block of the compressed data stream, the third data block having an associated third header;

generating, by the processing device, a third address for the third data block based on a third code length in the third header; and storing the third data block in the first portion of the CAM in an order with respect to the first code length, the second code length, and the third code length.

20. The non-transitory machine-readable storage medium of claim 17, the operations further comprising:

receiving a symbol associated with the data stream;

performing a lookup operation for a match to the symbol in the first portion of the CAM;

upon identifying a match to the symbol in the first portion of the CAM, identifying a corresponding row in a register file; and providing data from the corresponding row in the register file in an output data stream.

21. The non-transitory machine-readable storage medium of claim 17, wherein the first set of cells has a smaller data capacity than the second set of cells.

* * * * *